US009284104B2

(12) United States Patent
Godfroid et al.

(10) Patent No.: US 9,284,104 B2
(45) Date of Patent: Mar. 15, 2016

(54) DEPOSITION OF ULTRA-THIN INORGANIC OXIDE COATINGS ON PACKAGING

(71) Applicant: FRITO-LAY NORTH AMERICA, INC., Plano, TX (US)

(72) Inventors: Robert Godfroid, McKinney, TX (US); Glenn Jordan, Prosper, TX (US); Anthony Robert Knoerzer, Parker, TX (US); Kenneth Scott Laverdure, Plano, TX (US); Eldridge M. Mount, III, Canandaigua, NY (US)

(73) Assignee: FRITO-LAY NORTH AMERICA, INC., Plano, TX (US)

( * ) Notice: Subject to any disclaimer, the term of this patent is extended or adjusted under 35 U.S.C. 154(b) by 29 days.

(21) Appl. No.: 13/923,899

(22) Filed: Jun. 21, 2013

(65) Prior Publication Data
US 2013/0344240 A1 Dec. 26, 2013

Related U.S. Application Data

(60) Provisional application No. 61/663,555, filed on Jun. 23, 2012.

(51) Int. Cl.
*B05D 3/08* (2006.01)
*B65D 65/42* (2006.01)
(Continued)

(52) U.S. Cl.
CPC ............... *B65D 65/42* (2013.01); *C23C 16/02* (2013.01); *C23C 16/0218* (2013.01); *C23C 16/0272* (2013.01); *C23C 16/401* (2013.01); *C23C 16/403* (2013.01); *C23C 16/463* (2013.01);
(Continued)

(58) Field of Classification Search
CPC   C23C 16/02; C23C 16/0218; C23C 16/0272; C23C 16/401; C23C 16/403; C23C 16/463; C23C 16/213; C23C 16/545; C23C 16/56
USPC ........................................................ 427/223
See application file for complete search history.

(56) References Cited

U.S. PATENT DOCUMENTS 3,113,888 A   12/1963  Gold
3,217,957 A   11/1965  Jarvie et al.
(Continued)

FOREIGN PATENT DOCUMENTS

CN    1386631 A    12/2002
DE    19523530 C1   9/1996
(Continued)

OTHER PUBLICATIONS

"Nanophasen-Materialen" published in Rompp Lexikon Chemie, 10. Auflage, 1998, Thieme Verlag, Stuttgart; ISBN: 3-13-734910-9; vol. 4, p. 2804 (3 pages).
(Continued)

*Primary Examiner* — Kelly M Gambetta
(74) *Attorney, Agent, or Firm* — Colin P. Cahoon; Sudhakar V. Allada; Carstens & Cahoon, LLP

(57) ABSTRACT

An apparatus and method for depositing an ultra-thin inorganic coating on to a packaging film substrate is disclosed. Flame pretreatment enhances the quality of the inorganic coating. Multiple coating layers may be deposited onto the substrate by passing the substrate over various one or more flame head configurations in either a stand-alone or in-line manufacturing environment.

8 Claims, 20 Drawing Sheets

(51) Int. Cl.
    *C23C 16/02* (2006.01)
    *C23C 16/40* (2006.01)
    *C23C 16/46* (2006.01)
    *C23C 16/513* (2006.01)
    *C23C 16/54* (2006.01)
    *C23C 16/56* (2006.01)

(52) U.S. Cl.
    CPC .............. *C23C 16/513* (2013.01); *C23C 16/545* (2013.01); *C23C 16/56* (2013.01)

(56) References Cited

U.S. PATENT DOCUMENTS

| | | | |
|---|---|---|---|
| 3,258,386 A | 6/1966 | Blythe |
| 3,438,428 A | 4/1969 | Balamuth et al. |
| 3,459,610 A | 8/1969 | Dijkers et al. |
| 3,477,970 A | 11/1969 | Beeman |
| 3,498,798 A | 3/1970 | Baur |
| 3,647,111 A | 3/1972 | Stager |
| 3,657,033 A | 4/1972 | Sager |
| 4,198,256 A | 4/1980 | Andrews |
| 4,373,982 A | 2/1983 | Kreager |
| 4,414,045 A | 11/1983 | Wang |
| 4,418,841 A | 12/1983 | Eckstein |
| 4,517,790 A | 5/1985 | Kreager |
| 4,551,371 A | 11/1985 | Eckstein |
| 4,572,753 A | 2/1986 | Bach |
| 4,595,611 A | 6/1986 | Quick |
| 4,647,332 A | 3/1987 | Ranger |
| 4,859,513 A | 8/1989 | Gibbons |
| 4,892,911 A | 1/1990 | Genske |
| 4,975,133 A | 12/1990 | Gochermann |
| 4,982,872 A | 1/1991 | Avery |
| 5,057,182 A | 10/1991 | Wuchinich |
| 5,059,804 A | 10/1991 | Fink |
| 5,108,807 A | 4/1992 | Tucker |
| 5,153,061 A | 10/1992 | Cavagna |
| 5,155,604 A | 10/1992 | Miekka |
| 5,180,765 A | 1/1993 | Sinclair |
| 5,192,620 A | 3/1993 | Chu |
| 5,205,473 A | 4/1993 | Coffin |
| 5,213,858 A | 5/1993 | Tanner et al. |
| 5,216,043 A | 6/1993 | Sipinen |
| 5,230,963 A | 7/1993 | Knoerzer |
| 5,250,627 A | 10/1993 | Yamamoto |
| 5,296,070 A | 3/1994 | Take |
| 5,332,586 A | 7/1994 | DiMino |
| 5,391,423 A | 2/1995 | Wnuk |
| 5,458,933 A | 10/1995 | Suskind |
| 5,487,940 A | 1/1996 | Bianchini |
| 5,500,459 A | 3/1996 | Hagemeyer |
| 5,506,036 A | 4/1996 | Bergerioux |
| 5,508,113 A | 4/1996 | Knoerzer |
| 5,512,338 A | 4/1996 | Bianchini |
| 5,525,421 A | 6/1996 | Knoerzer |
| 5,540,962 A | 7/1996 | Suskind |
| 5,552,013 A | 9/1996 | Ehlert et al. |
| 5,587,058 A | 12/1996 | Gorodetsky et al. |
| 5,604,042 A | 2/1997 | Bianchini |
| 5,631,066 A | 5/1997 | O'Brien |
| 5,654,039 A | 8/1997 | Wenzel et al. |
| 5,679,421 A | 10/1997 | Brinton, Jr. |
| 5,731,093 A | 3/1998 | Chang |
| 5,736,204 A | 4/1998 | Suskind |
| 5,747,633 A | 5/1998 | Ito |
| 5,750,225 A | 5/1998 | Petty |
| 5,756,651 A | 5/1998 | Chen |
| 5,766,637 A | 6/1998 | Shine |
| 5,776,842 A | 7/1998 | Wood |
| 5,837,383 A | 11/1998 | Wenzel et al. |
| 5,849,374 A | 12/1998 | Gruber |
| 5,891,576 A | 4/1999 | Imai |
| 5,895,723 A | 4/1999 | Utz |
| 5,908,918 A | 6/1999 | Chen |
| 5,939,467 A | 8/1999 | Wnuk |
| 5,948,546 A | 9/1999 | Bafford |
| 5,985,772 A | 11/1999 | Wood |
| 6,003,670 A | 12/1999 | Beer |
| 6,025,028 A | 2/2000 | Asrar |
| 6,027,677 A | 2/2000 | Ostapchenko |
| 6,033,747 A | 3/2000 | Shiotani |
| 6,036,796 A | 3/2000 | Halbert |
| 6,071,618 A | 6/2000 | Cook |
| 6,080,478 A | 6/2000 | Karhuketo |
| 6,132,822 A | 10/2000 | Overcash |
| 6,146,508 A | 11/2000 | Gopalraja |
| 6,168,857 B1 | 1/2001 | Andersen |
| 6,176,953 B1 | 1/2001 | Landreth |
| 6,183,814 B1 | 2/2001 | Nangeroni et al. |
| 6,193,911 B1 | 2/2001 | Hunt |
| 6,200,404 B1 | 3/2001 | Andersen |
| 6,207,792 B1 | 3/2001 | Gruber |
| 6,232,389 B1 | 5/2001 | Feeney |
| 6,235,825 B1 | 5/2001 | Yoshida |
| 6,245,437 B1 | 6/2001 | Shiiki |
| 6,248,430 B1 | 6/2001 | Toyoda |
| 6,285,922 B1 * | 9/2001 | Bloss ........................... 700/274 |
| 6,294,047 B1 | 9/2001 | Chakar |
| 6,301,860 B1 | 10/2001 | Gunderman |
| 6,338,870 B1 | 1/2002 | Jaccoud |
| 6,350,531 B1 | 2/2002 | Sugimoto |
| 6,358,576 B1 | 3/2002 | Adur |
| 6,361,609 B1 | 3/2002 | Ouellette |
| 6,387,211 B1 | 5/2002 | Chakar |
| 6,492,613 B2 | 12/2002 | Bollinger et al. |
| 6,511,563 B2 | 1/2003 | Roylance |
| 6,523,732 B1 | 2/2003 | Popoola |
| 6,544,607 B1 | 4/2003 | Kuroki |
| 6,547,929 B2 | 4/2003 | Bobsein |
| 6,573,340 B1 | 6/2003 | Khemani |
| 6,574,944 B2 | 6/2003 | Capodieci |
| 6,576,294 B1 | 6/2003 | Phillips |
| 6,600,008 B1 | 7/2003 | Kobayashi |
| 6,645,584 B1 | 11/2003 | Kuusipaio |
| 6,649,732 B2 | 11/2003 | Kobayashi |
| 6,660,008 B1 | 12/2003 | Foerster |
| 6,660,211 B2 | 12/2003 | Topolkaraev |
| 6,677,048 B2 | 1/2004 | Karhuketo |
| 6,709,718 B2 | 3/2004 | O'Brien |
| 6,716,499 B1 | 4/2004 | Vadhar |
| 6,740,731 B2 | 5/2004 | Bigg |
| 6,769,229 B2 | 8/2004 | Kinigakis |
| 6,811,826 B2 | 11/2004 | Rule et al. |
| 6,815,079 B2 | 11/2004 | Rosenbaum |
| 6,824,632 B2 | 11/2004 | Blanchard |
| 6,863,644 B1 | 3/2005 | Cook |
| 6,877,975 B2 | 4/2005 | Wuchinich |
| 6,942,821 B2 | 9/2005 | Davrit |
| 6,960,374 B1 | 11/2005 | Terada |
| 6,974,612 B1 | 12/2005 | Frisk |
| 6,977,113 B2 | 12/2005 | Kody |
| 6,984,443 B2 | 1/2006 | Kuroki |
| 7,060,142 B2 | 6/2006 | Yamamoto |
| 7,128,969 B2 | 10/2006 | Busch |
| 7,132,490 B2 | 11/2006 | Obuchi et al. |
| 7,160,977 B2 | 1/2007 | Hale |
| 7,172,814 B2 | 2/2007 | Hudson |
| 7,173,080 B2 | 2/2007 | Yamada |
| 7,214,414 B2 | 5/2007 | Khemani |
| 7,223,359 B2 | 5/2007 | Torkelson |
| 7,351,449 B2 | 4/2008 | Hunt |
| 7,351,785 B2 | 4/2008 | Matsumoto |
| 7,368,160 B2 | 5/2008 | Inglis |
| 7,422,782 B2 | 9/2008 | Haedt |
| 7,514,528 B2 | 4/2009 | Kauffman |
| 7,520,959 B2 | 4/2009 | Kikuchi |
| 7,718,718 B2 | 5/2010 | Kanzawa |
| 7,771,551 B2 | 8/2010 | Schroeder |
| 7,785,682 B2 | 8/2010 | Sato et al. |
| 7,794,555 B2 | 9/2010 | LaFond |
| 7,842,761 B2 | 11/2010 | Flynn |
| 7,854,994 B2 | 12/2010 | Henderson-Rutgers |
| 7,943,218 B2 | 5/2011 | Knoerzer |
| 7,951,436 B2 | 5/2011 | Knoerzer |

(56) References Cited

U.S. PATENT DOCUMENTS

| | | | |
|---|---|---|---|
| 7,951,438 B2 | 5/2011 | Lee | |
| 8,105,667 B2 | 1/2012 | Knoerzer | |
| 8,201,606 B2 | 6/2012 | Specht | |
| 8,225,583 B2 | 7/2012 | Waldherr | |
| 8,507,084 B2 | 8/2013 | Deng | |
| 8,734,933 B2 | 5/2014 | Paolilli et al. | |
| 8,795,803 B2 | 8/2014 | Paolilli et al. | |
| 8,859,056 B2 | 10/2014 | O'Neill et al. | |
| 9,040,120 B2 | 5/2015 | Hunt | |
| 2001/0001284 A1* | 5/2001 | Shaw et al. | 428/216 |
| 2002/0014318 A1 | 2/2002 | Bobsein | |
| 2002/0098341 A1 | 7/2002 | Schiffer | |
| 2002/0127358 A1 | 9/2002 | Berlin | |
| 2002/0160201 A1 | 10/2002 | Ohkura | |
| 2003/0008136 A1 | 1/2003 | Bliznyuk | |
| 2003/0162013 A1 | 8/2003 | Topolkaraev | |
| 2003/0166748 A1 | 9/2003 | Khemani | |
| 2003/0193104 A1 | 10/2003 | Melican | |
| 2003/0215644 A1 | 11/2003 | Deshpande | |
| 2004/0029258 A1* | 2/2004 | Heaney et al. | 435/287.2 |
| 2004/0076778 A1 | 4/2004 | Mori | |
| 2004/0115424 A1 | 6/2004 | Cowton | |
| 2004/0185287 A1 | 9/2004 | Reighard | |
| 2004/0229327 A1 | 11/2004 | Agblevor | |
| 2005/0096422 A1 | 5/2005 | Torkelson | |
| 2005/0112363 A1 | 5/2005 | Ning | |
| 2005/0136202 A1 | 6/2005 | Kendig | |
| 2005/0194110 A1 | 9/2005 | Richardson | |
| 2006/0019045 A1 | 1/2006 | Bourgeois | |
| 2006/0046006 A1 | 3/2006 | Bastion et al. | |
| 2006/0057260 A1 | 3/2006 | Barry | |
| 2006/0069234 A1 | 3/2006 | Kauffman | |
| 2006/0099436 A1 | 5/2006 | Schwark | |
| 2006/0110615 A1 | 5/2006 | Karim | |
| 2006/0144905 A1 | 7/2006 | Oblak | |
| 2006/0159860 A1 | 7/2006 | Korowicki | |
| 2006/0177674 A1 | 8/2006 | Aritake | |
| 2006/0194010 A1 | 8/2006 | Hiscock | |
| 2006/0207295 A1 | 9/2006 | Huenermann | |
| 2006/0275563 A1 | 12/2006 | Duffy | |
| 2006/0286323 A1 | 12/2006 | Siegel | |
| 2007/0023123 A1 | 2/2007 | Sorensen | |
| 2007/0037912 A1 | 2/2007 | Mohanty | |
| 2007/0059541 A1 | 3/2007 | Yoshida | |
| 2007/0154719 A1 | 7/2007 | Meijlink et al. | |
| 2007/0158012 A1 | 7/2007 | Heil | |
| 2007/0184220 A1 | 8/2007 | Cleveland | |
| 2007/0224368 A1 | 9/2007 | Hara | |
| 2007/0259139 A1 | 11/2007 | Furneaux | |
| 2008/0038560 A1 | 2/2008 | Knoerzer | |
| 2008/0069988 A1 | 3/2008 | Sato | |
| 2008/0070047 A1 | 3/2008 | Rehkugler | |
| 2008/0073505 A1 | 3/2008 | Niu | |
| 2008/0107847 A1 | 5/2008 | Yamane et al. | |
| 2008/0131616 A1 | 6/2008 | Besson | |
| 2008/0241500 A1 | 10/2008 | Hoegg | |
| 2009/0017240 A1 | 1/2009 | Charbonnel et al. | |
| 2009/0022919 A1 | 1/2009 | Chicarella | |
| 2009/0061126 A1 | 3/2009 | Knoerzer | |
| 2009/0081396 A1 | 3/2009 | Hokari et al. | |
| 2009/0142614 A1 | 6/2009 | Mori | |
| 2009/0148713 A1 | 6/2009 | Lee | |
| 2009/0148715 A1 | 6/2009 | Lee | |
| 2009/0194450 A1 | 8/2009 | Dabadie | |
| 2009/0199964 A1* | 8/2009 | Fayet et al. | 156/278 |
| 2009/0200359 A1 | 8/2009 | Chen | |
| 2009/0220794 A1 | 9/2009 | O'Neill | |
| 2009/0250171 A1 | 10/2009 | Wieduwilt | |
| 2009/0253871 A1 | 10/2009 | Flynn | |
| 2009/0269580 A1 | 10/2009 | Shiba et al. | |
| 2009/0286090 A1 | 11/2009 | Ting | |
| 2009/0311544 A1 | 12/2009 | Lee | |
| 2009/0324917 A1 | 12/2009 | Wang | |
| 2009/0324972 A1 | 12/2009 | Hoffman et al. | |
| 2010/0009208 A1 | 1/2010 | Lee | |
| 2010/0040904 A1 | 2/2010 | Cloutier | |
| 2010/0062269 A1 | 3/2010 | Ogita | |
| 2010/0072104 A1 | 3/2010 | Kohl | |
| 2010/0101722 A1 | 4/2010 | Suto | |
| 2010/0147466 A1 | 6/2010 | Sans Marimon | |
| 2010/0151130 A1 | 6/2010 | Ammerlaan | |
| 2010/0178394 A1 | 7/2010 | Exner | |
| 2010/0178523 A1 | 7/2010 | Iyengar et al. | |
| 2010/0184891 A1 | 7/2010 | Akutsu et al. | |
| 2010/0209614 A1 | 8/2010 | Sakata | |
| 2010/0221560 A1 | 9/2010 | Knoerzer | |
| 2010/0330382 A1 | 12/2010 | Dou | |
| 2011/0005959 A1 | 1/2011 | Van Puijenbroek | |
| 2011/0027590 A1 | 2/2011 | Abe | |
| 2011/0072766 A1 | 3/2011 | Haus | |
| 2011/0081543 A1 | 4/2011 | Lee | |
| 2011/0104437 A1 | 5/2011 | Yamamura | |
| 2011/0200844 A1 | 8/2011 | Fayne | |
| 2011/0244185 A1 | 10/2011 | Dou | |
| 2012/0111476 A1 | 5/2012 | Bang | |
| 2012/0141766 A1 | 6/2012 | Paulino | |
| 2012/0219790 A1 | 8/2012 | Mount | |
| 2012/0288693 A1 | 11/2012 | Stanley et al. | |
| 2013/0101831 A1 | 4/2013 | Knoerzer et al. | |
| 2013/0101855 A1 | 4/2013 | Cham | |
| 2013/0122280 A1 | 5/2013 | Yokota | |

FOREIGN PATENT DOCUMENTS

| | | | |
|---|---|---|---|
| DE | 10347015 A1 | 4/2005 | |
| EP | 0058571 A1 | 8/1982 | |
| EP | 0229476 A1 | 7/1987 | |
| EP | 0333390 | 9/1989 | |
| JP | 2000-185381 | 7/2000 | |
| JP | 2003-191425 | 7/2003 | |
| JP | 2003-276144 | 9/2003 | |
| JP | 2014106314 A | 4/2004 | |
| JP | 2004-256570 | 9/2004 | |
| JP | 2004-351629 | 12/2004 | |
| JP | 2007-083409 | 4/2007 | |
| JP | 2011-63002 | 3/2011 | |
| WO | 9601736 | 1/1996 | |
| WO | 96/18544 A1 | 6/1996 | |
| WO | 96/31303 | 10/1996 | |
| WO | 2004-093883 A2 | 11/2004 | |
| WO | 2006/029835 A1 | 3/2006 | |
| WO | 2007/047133 A1 | 4/2007 | |
| WO | 2012/085060 A1 | 4/2013 | |

OTHER PUBLICATIONS

PCT International Search Report dated Nov. 22, 2013, from PCT Application No. PCT/US13/47106 (7 pages).

PCT International Search Report dated Dec. 2, 2013, from PCT Application No. PCT/US13/47128 (9 pages).

Tokiwa, Yutaka "Biodegradability of Plastics," Int. J. of Mol. Sci. Sep. 2009, 10(9)3722-3724, published online Aug. 26, 2009 (18 pages).

PCT International Search Report dated Feb. 21, 2014, from PCT Application No. PCT/US13/53478 (6 pages).

PCT International Search Report dated Feb. 21, 2014, from PCT Application No. PCT/US13/53473 (6 pages).

Machine translation of German Patent Publication No. DE10347015 A1 published on Apr. 28, 2005 (5 pages).

Machine translation of Japanese Patent Publication No. 2011/063002 A2 published on Mar. 31, 2011 (18 pages).

Kim & Chang translation of excerpt of Japanese Patent Publication No. 2011/063002 A2 published on Mar. 31, 2011 (1 page).

Hashimoto et al. (JP 2000-185381) English translation, Apr. 7, 2000 (10 pages).

PCT International Search Report dated Apr. 3, 2014 from PCT Application No. PCT/US13/68512 (8 pages).

Schmitz, Peter, et al. "Films," Ullmann's Encyclopedia of Industrial Chemistry, 5th ed., vol. A11 (1988), pp. 85-110 (26 pages).

Agarwal, Mukul, et al. "Characterization of the Degradation of Polylactic Acid Polymer in a Solid Substrate Environment," Biotechnol. Prog. 1998, vol. 14, pp. 517-526 (10 pages).

(56) References Cited

OTHER PUBLICATIONS

Devlieger, J.J., "Green plastics for food packaging," TNO Industrial Technology, Chapter 24, pp. 519-534, The Netherlands, date unknown.

Goldsberry, Clare, "The Greening of an Industry: PLA film coatings replacing thermoplastics," Modern Plastics Worldwide magazine, Feb. 2007, pp. 54 and 56, United States.

Kolybaba, M., "Biodegradable Polymers: Past, Present, and Future" The Society for Engineering in Agricultural, Food, and Biological Systems, Paper No. RRV03-00007, Oct. 2003, 15 pages.

Liu, Lillian,"Bioplastics in Food Packaging: Innovative Technologies for Biodegradable Packaging" San Jose State University Packaging Engineering, Feb. 2006, 13 pages.

Malwitz, Matthew M., et al., "Orientation of Platelets in Multilayered Nanocomposite Polymer Films," Journal of Polymer Science: Part B: Polymer Physics, vol. 41, 3237-3248 (2003) © Wiley Periodicals, Inc., United States.

NatureWorks LLC PLA Polymer 4032D "Biaxially Oriented Films—High Heat" pp. 1-3, © 2005.

Somiya, Satoshi, and Ooike, Takanobu, "Degradation phenomena under water environment of cotton yarn reinforced Polylactic-acid," T. Proulx (ed.), Time Dependent Constitutive Behavior and Fracture/Failure Processes, vol. 3, Conference Proceedings of the Society for Experimental Mechanics Series 15, DOI 10.1007/978-1-4419-9794-4_27, The Society for Experimental Mechanics, Inc. 2011, pp. 175-182.

NatureWorks LLC Health and Safety, "Material Safety Data Sheet" pp. 1-10, Jul. 19, 2006.

Smook, Gary A., The Handbook for Pulp and Paper Technologists, Chapter 14—Secondary Fiber, pp. 205-217, Mar. 2003.

* cited by examiner

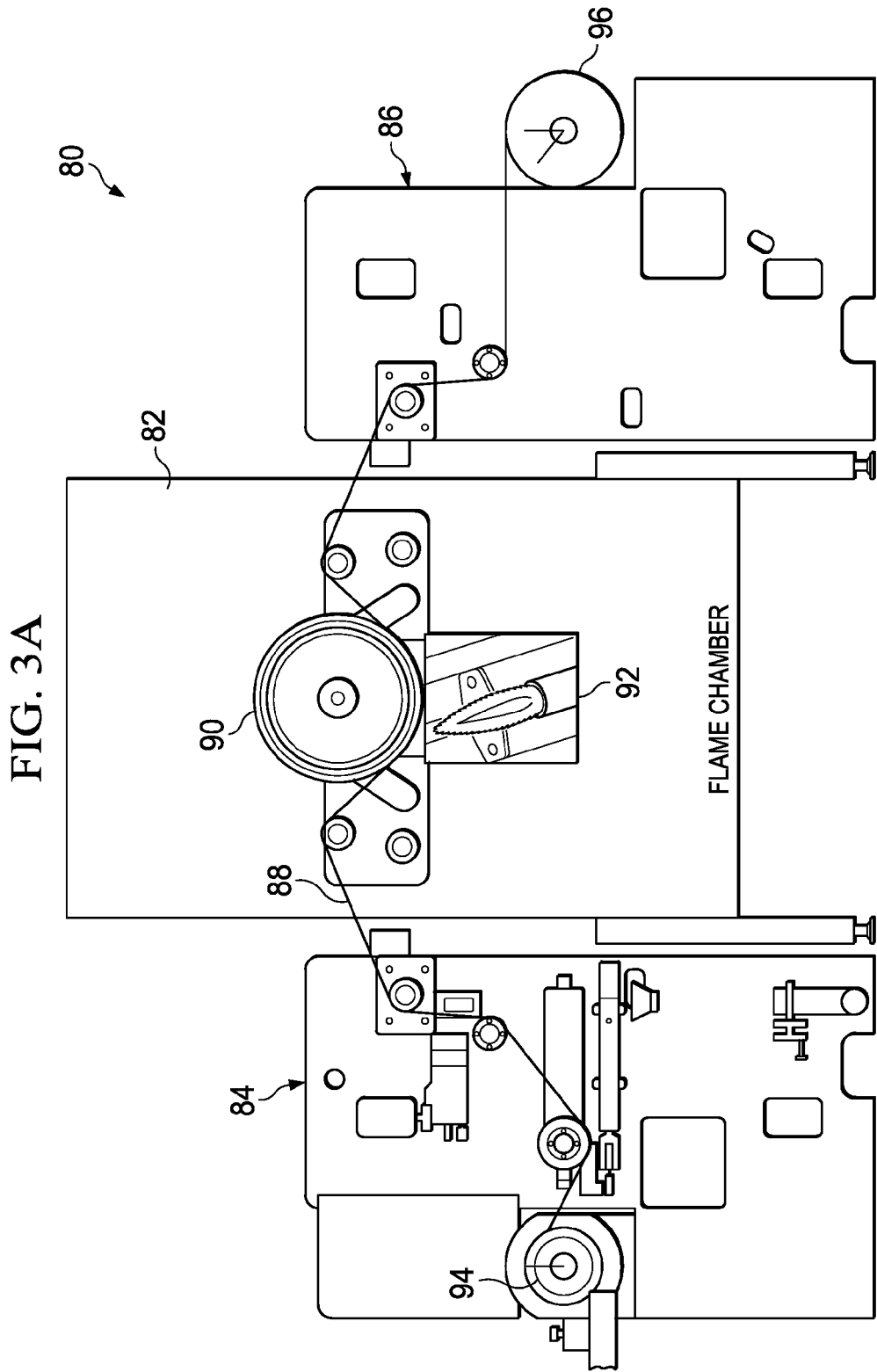

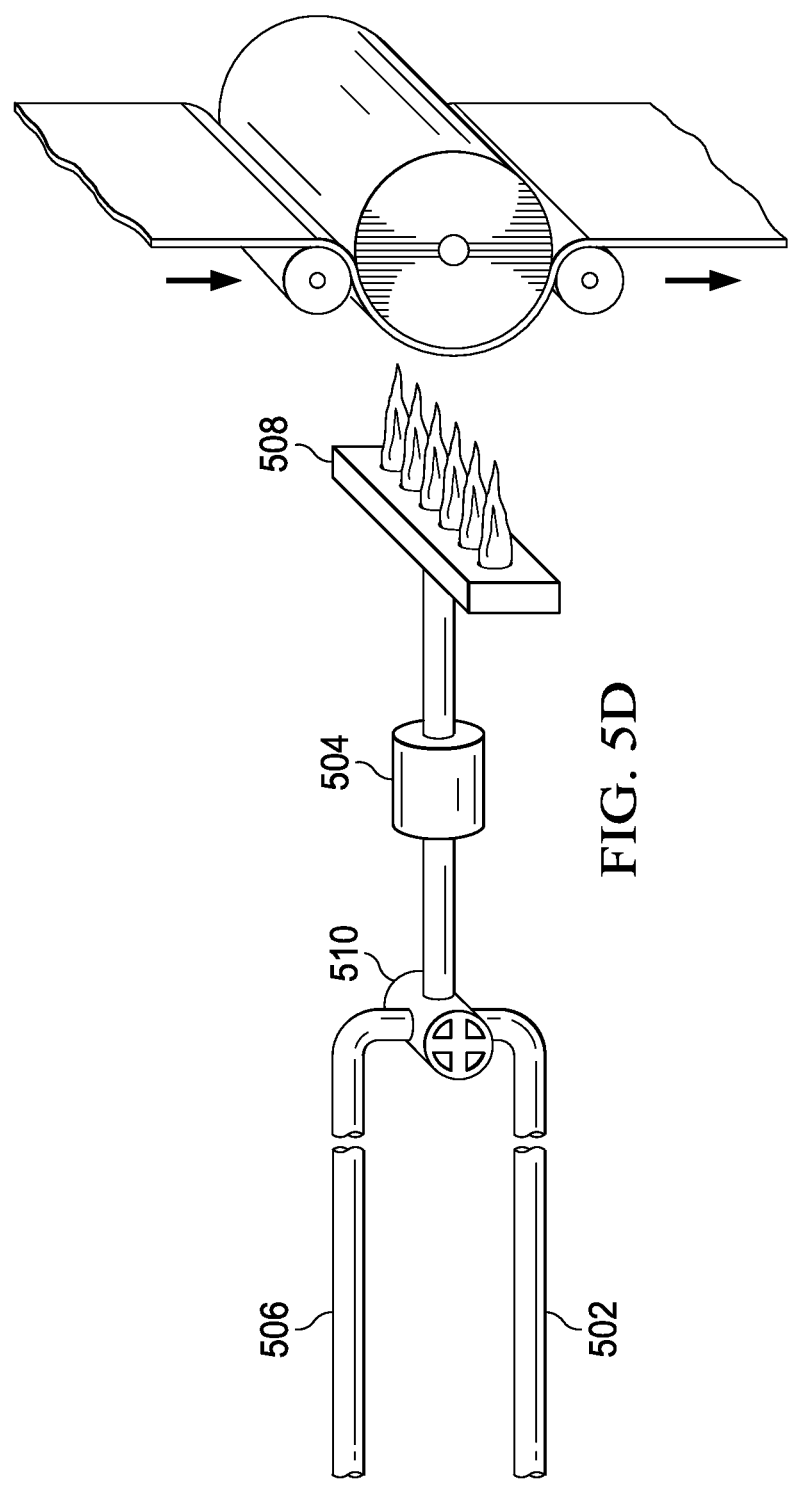

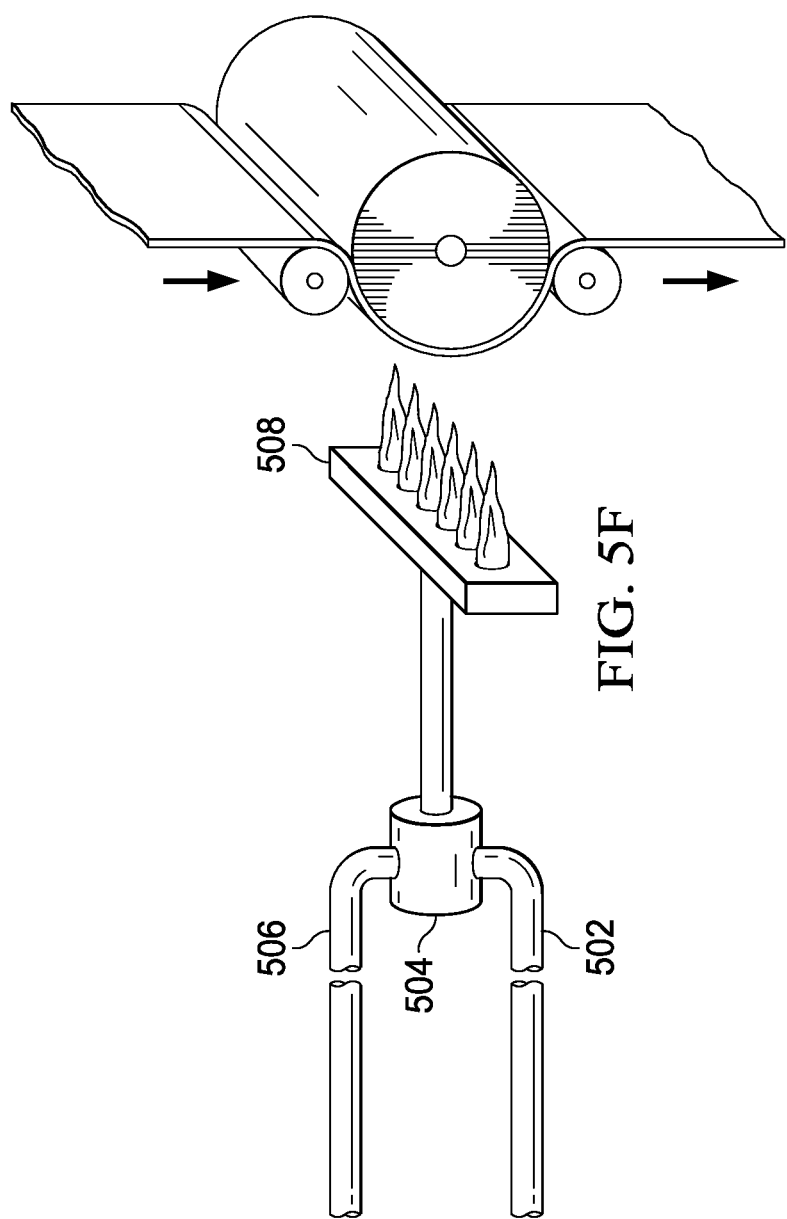

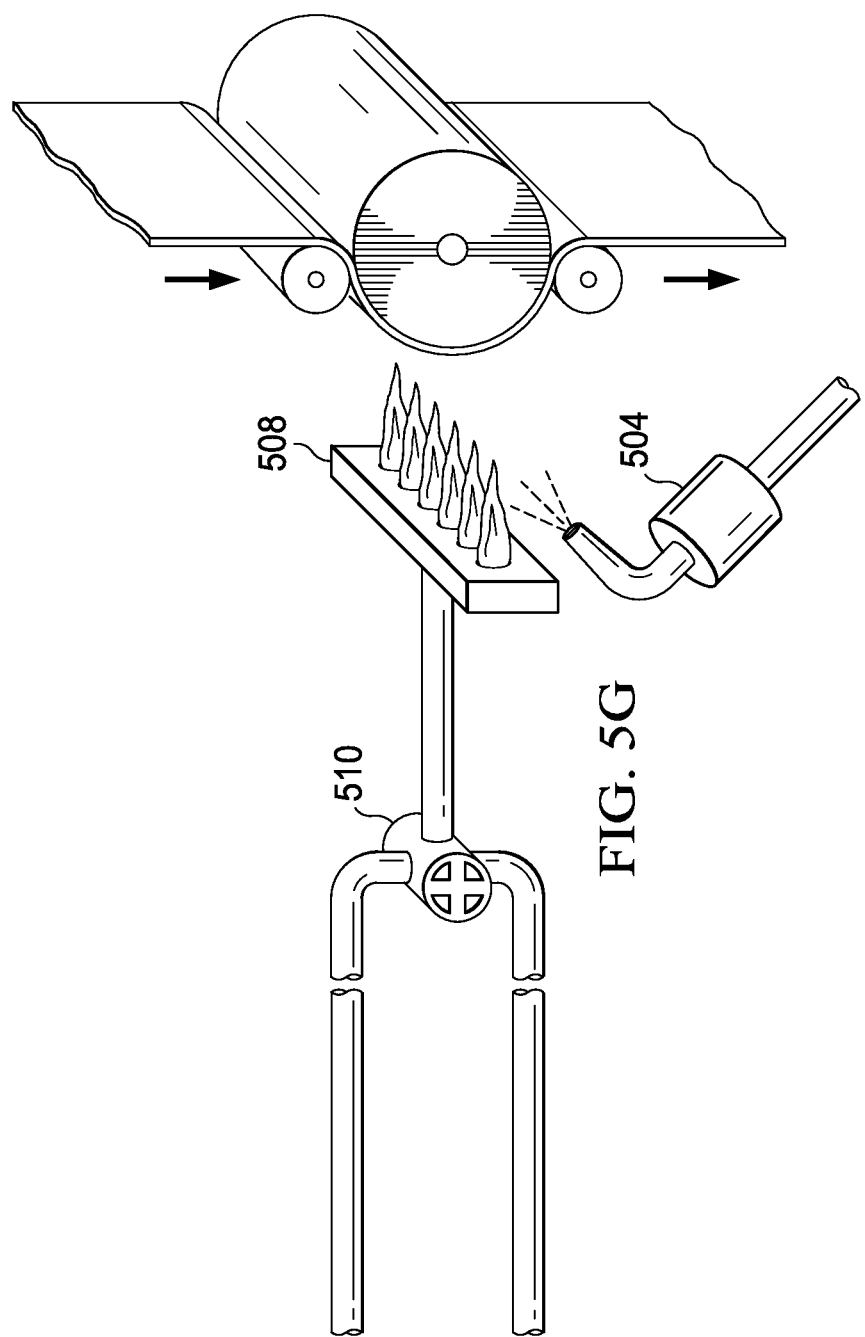

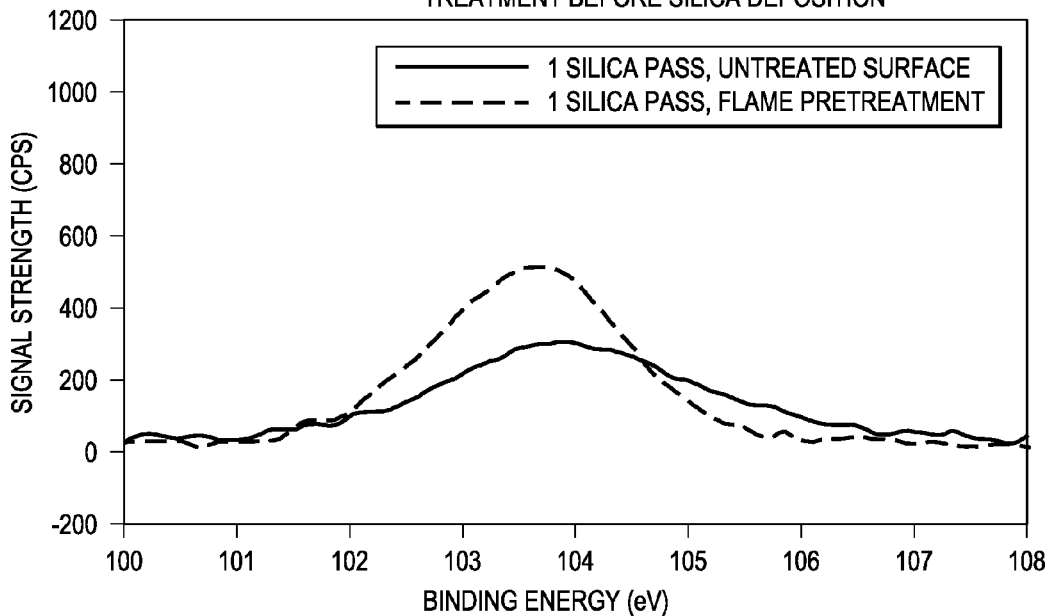
FIG. 6 — FIGURE X1, EFFECT OF FLAME TREATMENT BEFORE SILICA DEPOSITION
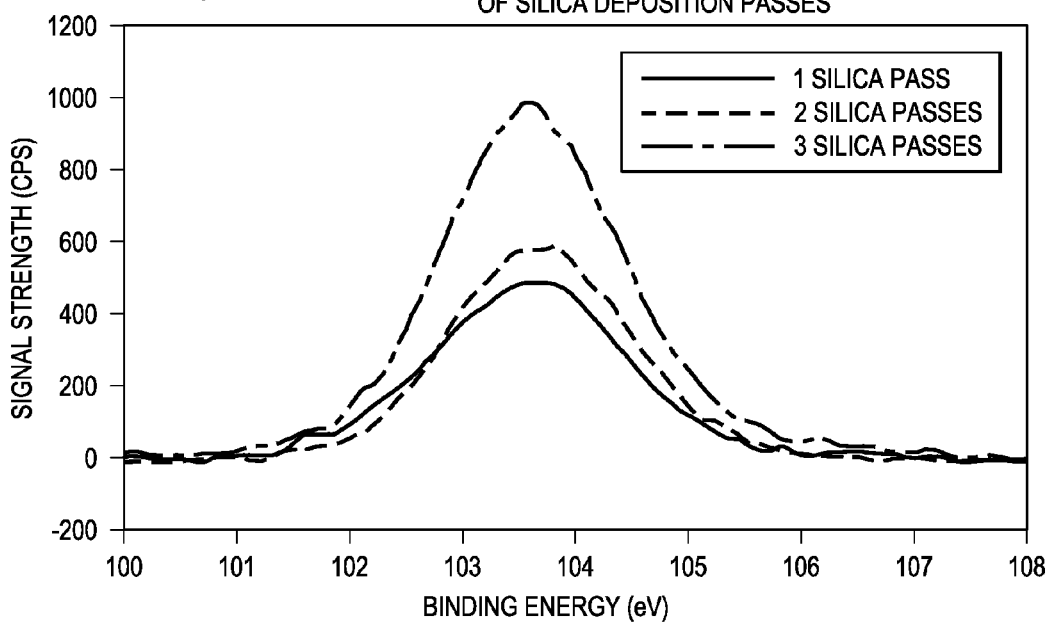
FIG. 7 — FIGURE X2, EFFECT OF NUMBER OF SILICA DEPOSITION PASSES

DEPOSITION OF ULTRA-THIN INORGANIC OXIDE COATINGS ON PACKAGING

CROSS REFERENCE TO RELATED APPLICATION

This application claims the benefit of provisional U.S. Application No. 61/663,555 entitled "Deposition of Ultra-Thin Inorganic Oxide Coatings on Packaging" filed Jun. 23, 2012.

BACKGROUND OF THE INVENTION

1. Technical Field

The present invention relates to an elemental layer on a packaging substrate and the method and apparatus for applying the elemental layer. More specifically, the invention disclosed herein pertains to an ultra-thin inorganic metal oxide layer that serves as an oxygen and water vapor barrier layer and/or to serve as an interface for future functionalization when applied to a packaging substrate. This layer can be formed during the manufacture of the packaging substrate or in later processing stages by use of known chemical vapor deposition apparatus and methods in a commercial packaging substrate manufacturing context.

2. Description of Related Art

Multi-layered packaging substrates made from petroleum-based products, polymers, copolymers, bio-polymers and/or paper structures are often used where there is a need for advantageous barrier, sealant, and graphics-capability properties. Barrier properties in one or more layers comprising the packaging substrate are important in order to protect the product inside the package from light, oxygen and/or moisture. Such a need exists, for example, for the protection of foodstuffs that may run the risk of flavor loss, staling, or spoilage if sufficient barrier properties are not present to prevent transmission of light, oxygen, or moisture into or out of the package. A graphics capability may also be required so as to enable a consumer to quickly identify the product that he or she is seeking to purchase, which also allows food product manufacturers a way to label information such as the nutritional content of the packaged food, and present pricing information, such as bar codes, to be placed on the product.

In the packaged food industry, protecting food from the effects of moisture and oxygen is important for many reasons, including health, safety, and consumer acceptability (i.e., preserving product freshness and taste). Conventional methods to protect food contents incorporate specialized coatings or layers within or on a surface of the packaging substrate, which function as an impervious barrier to prevent the migration of light, water, water vapor, fluids and foreign matter. These coatings may consist of coextruded polymers (e.g., ethyl vinyl alcohol, polyvinyl alcohol, polyimides, polyamides (i.e. nylons and polyvinyl acetate) and/or a thin layer of metal or metal oxide, depending on the level of barrier performance required to preserve the quality of the product stored within the package volume.

Coatings produced by chemical vapor deposition are known to provide certain barrier characteristics to the coated substrate. For example, an organic coating such as amorphous carbon can inhibit the transmission of elements including water, oxygen and carbon dioxide. Accordingly, carbon coatings have been applied to substrates, for example, polymeric films, to improve the barrier characteristics exhibited by the substrate. Another example of coatings applied to substrates to improve barrier adhesion performance includes coatings comprised of inorganic materials such as inorganic metal oxides. Ethyl vinyl alcohol and other polymer skin layers are widely used to prime or improve the wettability of film substrates for the application of a barrier layer also referred to herein as "metallization primer". Aluminum metal, aluminum oxide, and silicon oxide are widely used for the application of barrier layer(s) directly to the substrates also referred to herein as "metallization".

The inorganic coatings described above may be deposited onto substrates through various techniques as known in the art. Such techniques include physical vapor deposition (PVD) or chemical vapor deposition (CVD) processes. Examples of PVD include ion beam sputtering and thermal evaporation. Examples of CVD include glow discharge, combustion chemical vapor deposition (CCVD) and plasma enhanced chemical vapor deposition (PECVD) by generation of flame plasma or in strong electric fields.

The most commonly known and utilized method for depositing barrier layers on packaging substrates for metallization requires the use of a vacuum chamber to provide the vacuum environment for the deposition of inorganic atoms/ions on to the film substrate surface. This known technique, as used in the food packaging industry, consists of processing packaging substrate rolls that are from less than one to three meters wide and 500 to 150,000 meters in length running at industry speeds of 60-600 meters/min and higher in a vacuum metallization chamber. This equipment is highly specialized, requires a great deal of electrical power and requires large capital expense. Current vacuum chamber processes for metalizing films is inefficient in many respects due to the high operational costs and limited production capacity associated with the use of such equipment. Moreover, higher quality film substrates, requiring additional capital expenditure, must typically be used to achieve the desired barrier properties.

Combustion chemical vapor deposition (CCVD) and plasma enhanced chemical vapor deposition (PECVD) apparatus and methods are known in the art, as disclosed in U.S. Pat. Nos. 5,997,996 and 7,351,449, the disclosures of which are hereby incorporated by reference. Typically, a combustion flame or plasma field provides the environment required for the deposition of the desired coating (via the vapors and gases generated by the combustion or plasma) onto the substrate. The elemental precursors (e.g. organometallics) may be vaporous or dissolved in a solvent that may also act as a combustible fuel. The deposition of organic and inorganic oxides may then be carried out under standard and/or open atmospheric pressures and temperatures without the need of a vacuum chamber, furnace and/or pressure chamber.

As described above, the application of barrier to food packaging is required to protect food and food products from the effects of moisture and oxygen. It is well known in the art that metalizing a petroleum-based polyolefin such as OPP or PET reduces the moisture vapor and oxygen transmission through specialty film by approximately three orders of magnitude. Conventional technology employs an inorganic layer of metal or ceramic on a specialized polymer film. The inorganic layer may be aluminum, silicon, zinc, or other desired element in a metal or oxide form. However, the surface of the substrate onto which the barrier layer will be applied is typically primed to increase its surface energy so as to be receptive to the metal barrier to be deposited thereon and/or to "smooth" the surface to be metalized so as to reduce the surface gauge variation or surface roughness of the film to be metalized. The term "wettability" is defined herein to include surface energy, metal adhesion bond strength, and any other associated characteristic that would increase the receptiveness of the film layer surface for deposition of an inorganic ultra-thin as disclosed herein.

For example, the utilization of aluminum metal as a barrier layer on low energy plastics, such as biaxially oriented polypropylene (BOPP) film, requires a metallization primer to reduce the gauge variation of the film substrate surface and/or to improve the adhesion or bond between the metal and film substrate. Various chemical methods are employed to prime the substrate surface layer for improving the substrate surface and/or bonding of the metal barrier layer to the film substrate. With polymer film substrates, one method to prime the substrate for metallization is to co-extrude a specialized polymer as a skin layer on the substrate film. These skin layers may comprise ethyl vinyl alcohol (EVOH), polyvinyl alcohol (PVOH), and polyvinyl acetate (PVA), ethyl vinyl acetate (EVA), polyethylene terephthalate glycol (PETG), amorphous polyethylene terephthalate (aPET), among other polymers used in the industry. Unfortunately, these materials are quite expensive and add additional cost to the manufacture of metallization ready films. Plastic film cores, such as oriented polypropylene (OPP), polystyrene (PS), and polyethylene terephthalate (PET) are typically treated with corona discharge or flame treatment. However, these treatments tend to create undesired, adverse impacts on film substrate characteristics such as the formation of pin holes, chemical degradation of the surface through cross linking or intra-molecular chain scission that can adversely affect downstream metallization and heat sealing processes.

As such, there exists a need for an improved apparatus and method for depositing an ultra-thin inorganic oxide layer onto a packaging substrate to prime a substrate for metallization. Likewise, a need exists in the art for an improved apparatus and method for depositing multiple ultra-thin layers of an inorganic oxide layer on to a packaging substrate to enhance the barrier properties of a packaging substrate, which is less expensive and more energy efficient than tradition metallization while achieving and maintaining high quality barrier characteristics.

SUMMARY OF THE INVENTION

The inventive embodiments disclosed herein include a packaging substrate with an ultra-thin barrier layer and an apparatus and method for applying an ultra-thin inorganic metal oxide barrier layer to a film substrate. In one embodiment, the apparatus and method disclosed herein use the direct combustion of liquids, gases and/or vapors that contain the chemical precursors or reagents capable of producing inorganic oxides which are deposited on to the surface of a film substrate at open atmosphere. Chemical precursors, for example tetraethyl orthosilicate, tetramethyl disiloxane, silicon tetrachloride, silane, trimethylaluminium, triethylaluminium, methylaluminiumdichlorid-diethyletherate, trimethylaluminium-diethyletherate, ethylaluminiumdichlorid-diethyletherate, diethylaluminium-dimethylamide, aluminum trichloride, and other aluminum halides may be sprayed or atomized in an oxidant and combusted resulting in a vapor and/or gas that is directed on to the surface of the substrate via one or more flame heads for forming the desired coating or multiple coatings thereon. Multiple coating layers may be deposited onto the substrate by passing the substrate through the system in either a stand-alone or in-line manufacturing environment, or by passing the substrate over various one or more flame head configurations in either a stand-alone or in-line manufacturing environment as disclosed herein.

One embodiment of the present invention comprises a packaging substrate surface with an inorganic metal oxide layer of less than 50 nm thickness that is constructed by depositing multiple ultra-thin layers of inorganic metal oxide on to a surface of the packaging substrate. In various embodiments, a preferred process that can accomplish deposition of an inorganic oxide layer onto the packaging substrate surface is CCVD or PECVD in an open atmosphere utilizing novel flame head assembly designs and orientations to provide and adjust as for various precursor concentrations and coating thicknesses that are deposited on to the film substrate.

The inventive embodiments described herein may be implemented in stand-alone configurations, retrofitted to existing film production lines, or installed into an in-line film substrate manufacturing and/or processing system. The substrate material to be coated does not need to be heated or treated in a furnace or reaction chamber, or placed under vacuum or non-standard atmospheric conditions to effect coating deposition. The heat of combustion provides the needed conditions for the reaction of the chemical precursors. The substrate material being coated is likewise heated by the combustion flame, which creates and/or enhances the kinetic environment for surface reactions, wettability, diffusion, film (coating) nucleation and film (coating) growth. The chemical precursors utilized need to be properly reactive to form the desired coating. While inorganic metal oxides are the preferred material for the coating applied to the packaging substrate, other elemental coatings and compounds, for example metals, nitrides, carbides, and carbonates may also be used as desired.

In one embodiment of the invention, a method of coating a film substrate with at least one inorganic oxide layers comprises pretreating said substrate by passing said substrate through at least one flame treatment flame head assembly supplied with no inorganic oxide precursor, and after said pretreating step, depositing one or more inorganic oxide layers on said substrate by passing said substrate through one or more deposition flame heads on at least one deposition flame head assembly supplied with at least one inorganic oxide precursor, wherein said pretreating and depositing steps occur at open atmosphere.

In another embodiment, the at least one inorganic oxide precursor comprises at least one of tetraethyl orthosilicate, tetramethyl disiloxane, silicon tetrachloride, silane, trimethylaluminium, triethylaluminium, methylaluminiumdichlorid-diethyletherate, trimethylaluminium-diethyletherate, ethylaluminiumdichlorid-diethyletherate, diethylaluminium-dimethylamide, aluminum trichloride, and aluminum halides.

In one embodiment, the pretreating step comprising passing said substrate over a portion of at least one chill roll. In another embodiment, the pretreating step comprises passing said substrate over a portion of multiple chill rolls. The chill roll can comprise a temperature of 40° C. to 80° C.

In one embodiment, the depositing step comprises depositing multiple inorganic oxide layers on said substrate by passing said substrate through two or more deposition flame heads in series. In another embodiment, the pretreating and depositing steps occur as said film substrate is unwound from one roll and wound onto a second roll. The pretreating and depositing steps may occur in-line during manufacturing of said film substrate.

In one embodiment, the film substrate is cooled during said pretreating step by spraying cooling fluid on said film substrate.

In one embodiment of the invention, a system for coating a packaging film substrate with an inorganic oxide layer comprises at least one flame treatment flame head assembly supplied with no inorganic oxide precursor, one or more deposition flame heads supplied with at least one inorganic oxide precursor placed in series on at least one deposition flame head assembly, wherein said substrate passes through said flame treatment flame head assembly before said substrate passes through said deposition flame head assembly, and wherein said at least one flame treatment flame head assembly and said one or more deposition flame heads are at open atmosphere.

In another embodiment, the at least one flame treatment flame head assembly or said at least one deposition flame head assembly comprises multiple flame head assemblies oriented in parallel rows perpendicular to a substrate movement direction.

In one embodiment, the at least one flame treatment flame head assembly or said at least one deposition flame head assembly comprises a square or rectangular shaped flame head assembly. In another embodiment, the at least one flame treatment flame head assembly or said at least one deposition flame head assembly comprises multiple flame heads assemblies oriented in rows parallel to a substrate movement direction. In still another embodiment, the at least one flame treatment flame head assembly or said at least one deposition flame head assembly comprises a curved flame head assembly.

In one embodiment, the at least one flame treatment flame head assembly or said at least one deposition flame head assembly is oriented at an angle relative to a surface of said substrate. In another embodiment, the substrate passes through said flame head assemblies as it passes over a portion of said at least one chill roll.

In one embodiment, the inorganic precursors are fed into a flame fuel line of said deposition flame heads prior to being mixed with air from an air line and combusted at said flame heads, into an air line of said deposition flame heads prior to being mixed with fuel from a fuel line and combusted at said flame heads, into an air line and a fuel line of said deposition flame heads prior to being mixed and combusted at said flame heads, or mixed with an air/fuel mixture prior to being fed to said deposition flame heads. In another embodiment, the inorganic precursors is injected into a flame produced by said deposition flame heads.

Other aspects, embodiments and features of the invention will become apparent from the following detailed description of the invention when considered in conjunction with the accompanying figures. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

BRIEF DESCRIPTION OF THE FIGURES

The novel features believed characteristic of the invention are set forth in the appended claims. The invention itself, however, as well as a preferred mode of use, further objectives and advantages thereof, will be best understood by reference to the following detailed description of illustrative embodiments when read in conjunction with the accompanying figures, wherein:

FIGS. 3A-3E are depictions of the apparatus and method as integrated into in-line packaging substrate production and manufacturing equipment according to one embodiment of the invention disclosed herein;

FIGS. 5A-5I are depictions of various apparatus embodiments which may be employed in the present invention disclosed herein;

FIG. 6 is a graph showing, for a single deposition pass of silica, the amount of silica deposited as determined by signal strength via information collected by XPS.

FIG. 7 is a graph showing a signal strength (CPS) vs. binding energy (eV) from XPS for multiple passes.

DETAILED DESCRIPTION

Figure 1:
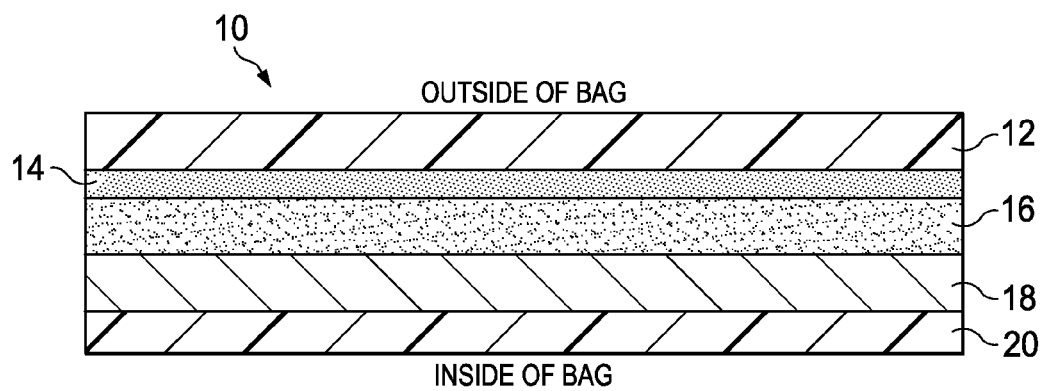
FIG. 1 depicts a cross-section view of a typical prior art food packaging film substrate.

FIG. 1 depicts a schematic cross-section of a typical, currently used food packaging multi-layer or composite film substrate 10. Film 10 is constructed of various intermediate layers that act in concert to provide the film 10 with the required performance characteristics. For example, a graphics layer 14 allows a graphic to be printed or otherwise disposed thereon and is protected by transparent exterior base layer 12 which may consist of oriented polypropylene (OPP) or polyethylene terephthalate (PET). A glue or laminate layer 16, which is typically a polyethylene extrusion, acts to bind the exterior base layer 12 with the inner, product-side base layer 18. A metal layer may be disposed upon inner base layer 18 by means of metallization known in the art. Sealant layer 20 is disposed upon the OPP or PET interior base layer 18 to enable a hermetic seal to be formed at a temperature lower than the melt temperature of the interior base layer 18. Each layer described is formed as a roll of film that is then unwound and laminated together to form the composite film. Each film being laminated together forms the composite films, which are film structures composed of multiple layers when originally extruded or fabricated.

Alternative materials used in the construction of packaging film substrates may include polyesters, polyolefin extrusions, cellulosic polymers, acetate polymers, adhesive laminates, bio-films such as polylactic acid (PLA) films and polyhydroxy-alkanoate (PHA) films, produced in various combinations resulting in composite, multi-layered film structures. The film substrate may be formed by typical coextrusion, lamination, or extrusion coating techniques as known in the art. The film substrate can also be composed of polyimide, liquid crystal, polyethylene, or other materials normally used in electronic, optic or specialty packaging or multilayer applications.

In both PECVD and CCVD processes described herein, the localized environment required for coating deposition to occur is provided by the flame, plasma or other energy means. With CCVD and PECVD no furnace, auxiliary heating, or reaction chamber is necessary for the reaction to occur. Further, both CCVD and PECVD can be carried out in open-atmosphere conditions. The plasma or flame supplies the energy needed for coating deposition in the forms of the kinetic energy of the species present and radiation. This energy creates the appropriate thermal environment to form reactive species and coincidentally heats the substrate, thus providing the kinetic conditions for surface reactions, diffusion, nucleation, and growth to occur. When using combustible solutions, the solvent plays two primary roles. First, the solvent conveys the coating reagents into the vicinity of the substrate where coating deposition occurs, thereby allowing the use of low cost soluble precursors. Uniform feed rates of any reagent stoichiometry can be produced easily by simply varying the reagents' concentrations in solution and the solution flow rate. Second, the combustion of the solvent produces the flame required for CCVD and PECVD.

In general, the deposition processes described herein are performed under ambient conditions in the open atmosphere to produce an inorganic film on a substrate. The film preferably is amorphous, but may be crystalline, depending on the reagent and deposition conditions. The reagent, or chemically reactive compound, is dissolved or carried in a solvent, typically a liquid organic solvent, such as an alkene, alkide or alcohol. The resulting solution is sprayed from a nozzle using oxygen-enriched air as the propellant gas and ignited. A substrate is positioned at or near the flame's end. Flame blow-off may be prevented by use of a hot element such as a small pilot light. The reactants are combusted in the flame and the ions or radicals generated from the combustion are deposited on the substrate as a coating. For the present invention, the formation and rate of deposition of the inorganic oxide layer(s) are important to the quality of the coating produced and the invention disclosed herein describes in various embodiments and examples of the equipment and processes for producing such quality coatings.

The methods and apparatus utilized to perform the inventive methods disclosed herein provide a less-energy intensive and more efficient method for the surface treatment of film substrates for a variety of applications. For example, priming a substrate for metallization is usually required to enhance the wettability of the substrate surface for the reception of a metalized layer. As previously discussed, prior art methods of priming a substrate for metallization typically require the addition of a skin layer via coextrusion or solution coating of chemical additives such as EVOH and/or treatment by flame or Corona discharge prior to metallization. The apparatus and methods herein provide a novel method by which the surface energy of the film substrate is raised typically between 1 and 10 dynes by the addition of the inorganic primer nanolayer, thereby enhancing the wettability of the substrate surface and thus improving the adhesion between the deposited metal barrier coating and the substrate.

It is also important for the inorganic oxide layer(s) to enable future vapor deposition of barrier, printing or adhesive layers applied to the film substrate to adhere well and for hot seal processes to still function as desired. An integral aspect of the invention includes application of the inorganic oxide layer to the film substrate so as to improve the surface wettability of the substrate surface for future applications.

By using different inorganic materials, additional properties can be created to enhance the use of the film for various applications. For example, use of silver can provide antimicrobial/disinfection properties. In other embodiments, ultraviolet radiation blocking inorganics, including zinc oxides and tin oxides may be utilized to form a clear ultra-violet light and gas barrier layer. Other transparent materials, for example silica oxide, may be used to form and/or act as ultra-thin barrier layer(s).

A key economic feature in using polymer-based products is maintaining low cost. As a result, the inorganic materials used as nanolayer coatings are typically selected from low cost inorganic elements. Also, the health aspect of the materials used in the formation of films for packaging is very important since the polymer films are used most often in consumer products including food and medical packaging. Thus, health safe materials, for example silica-based inorganics, may be utilized in various embodiments. Silica is the most common oxide of the earth's crust and soil and long-term storage in glass containers has extensive proven history as a safe and effective storage medium with regard to human health requirements.

The use of current surface modifying materials in film production represents a significant volume and weight fraction of the end product thus reducing its recyclability. The present invention greatly reduces the material required to form the desired barrier thickness, resulting in a more recyclable and/or compostable product. In one an embodiment, the inorganic oxide layer is generally less than 10 nm thick and more preferably less than 5 nm average thickness. Due to the small thickness of such a layer, the inorganic oxide layer more readily breaks into smaller pieces resulting in a higher grade of recyclable material. In fact, silica is often used as an enhancement additive to polymers to improve strength and durability. One embodiment of the invention includes an inorganic oxide layer that alters the bulk physical properties of film base polymer, as compared to reprocessing of neat polymer, by less than 1%.

For biodegradable polymers, such as PLA and PHA, a barrier layer applied to a film substrate incorporating PLA and/or PHA or other bio-polymer may in fact detract from the desired degradability of the packaging material resulting therefrom. Such a barrier layer reduces the transmission of moisture or oxygen that can affect the degradation process of the film package. Multiple layers of barrier can result in a package that does not degrade due to the core film substrate material (barrier on both sides) never being exposed to the proper environment for decomposition. An embodiment of the present invention includes forming an inorganic oxide coating that alone does not provide an impervious barrier, but enables subsequent printing, adhesion layers, or quality barrier layer(s) to be deposited upon the inorganic oxide coating in an online manufacturing context or a secondary downstream facility. In one embodiment, the inorganic oxide layer can be deposited on both sides of the packaging substrate for a variety of contemplated end uses.

One of the key uses of the smooth inorganic ultra-thin layer is subsequent barrier layer formation thereon. Thin film metallization or oxide barrier layers adhere to and perform better on smooth surfaces with low defects. Polymer films readily form such surfaces during manufacturing, but the addition of anti-block agents as currently used in the industry cause an increase in the film's surface roughness and defects, with RMS generally greater than 100 nm. A key aspect of the present invention results in packaging substrates with surface roughness than 30 nm RMS, and more preferably less than 10 nm RMS, and in some cases less than 5 nm RMS.

In another embodiment, the invention disclosed herein produces the ability to maintain low surface RMS values while controlling the surface wetting properties. The surface tension can be controlled by a combination of the inorganic ultra-thin layer's surface roughness and also the termination material on the surface. To improve the adhesion of inorganic barrier layer materials to the substrate, it is desired that a surface of the substrate be receptive to metal or inorganic oxide ionic or covalent bonding. Inorganic oxide surfaces provide excellent bonding sites for both metal and oxide layers, along with a smooth surface coating. It has been discovered that surface smoothness enhances the formation of barrier layer(s) on the substrate. For barrier deposition applications, it is preferred that the substrate surface to be coated has a smooth, low texture surface on both the nanometer and micrometer scale.

One key to successful application of such interface layers is to form and apply the primer and barrier layers to the substrate prior to winding or rolling of the film. Films are made by a number of processes including cast and blown films. These processes are typically performed at ambient atmosphere and pressure on large production lines. The introduction of prior art vacuum deposition equipment into such a line makes such processes economically impractical. Thus, a method for forming films online with an inorganic ultra-thin layer at ambient pressure on low temperature polymers is a better pathway to accomplish such an inventive ultra-thin layer. Aspects of how to do this with a process such as CCVD are disclosed in U.S. Pat. No. 5,652,021 (Hunt et al.) and U.S. Pat. No. 5,863,604 (Hunt et al.), the disclosures of which are incorporated herein by reference.

In order to form an effective barrier layer in subsequent processing operations, it is important for the film substrate surface to be smooth. Thin film barrier requires a smooth substrate surface without features that can shadow or inhibit the thin film material from being deposited onto the vast majority of the entire surface. It is preferred that at least 90% of the substrate surface be coated and even more preferred that over 99% be accessible to vapor deposition material without surface roughness that can cause shadowing or thin film defects. It is also important that the inorganic primer layer is very smooth so that it will not impact the dense uniform continuous growth of additional inorganic oxide layer(s) deposited thereon to build an effective thin film barrier layer. Columnar growth on the inorganic primer layer will have a negative impact on the subsequent growth of a vacuum deposited or other thin film barrier layer applied thereto. The end effect is that a subsequent barrier layer can be grown to yield a Oxygen Transmission Rate (OTR) of less than 10 $cc/m^2/day$ @ 23° C. and 0% RH and a Water Vapor Transmission Rate (WVTR) of less than 2 $g/m^2/day$ @ 38° C. and 90% RH, more preferably OTR<2 $cc/m^2/day$ @ 23° C. and 0% RH and WVTR<1 $g/m^2/day$ @ 38° C. and 90% RH, and even more preferably OTR<1 $cc/m^2/day$ @ 23° C. and 0% RH and WVTR<0.2 $g/m^2/day$ @ 38° C. and 90% RH on substrates where an inorganic primer layer is deposited prior to the barrier layer. In one embodiment, the primer and/or barrier layer is transparent to light in the visible spectrum. In alternative embodiments, the subsequent primer and/or barrier layers may be translucent or opaque as appropriate for effective utilization of the coated substrate for flexible packaging or other contemplated end uses.

The current invention also has minimal environmental impact and yields a safer packaging material as a result of the reduction in the number of organic chemicals blended into the polymer film substrate. Such additives can cause health concerns or can reduce the quality of recyclable material. Silica, alumina, and the other elements of the present invention are common in the earth's crust, are often used as food additives, and have been used safely in glass containers for many years. As a result, the invention disclosed herein utilizes plentiful and non-toxic, safe inorganic materials with essentially no detrimental environmental impact.

Multilayer packaging substrates may be produced with excellent bonding characteristics provided by application of one or more ultra-thin inorganic oxide layers as described herein. In various embodiments, moisture, oxygen and light can pass through the inorganic oxide layer(s) so that compostable polymer film structures can still be decomposed under typical environmental conditions. The inorganic oxide coating with proper selection of metalloid or metal element, such as silicon or aluminum, creates a thin coating that will not inhibit composting of the film substrate and has absolute minimal impact on the environment.

In one embodiment disclosed herein, a PECVD or CCVD apparatus is used to deposit one or more ultra-thin layers of silica oxide ($SiO_x$) and/or other inorganic oxides on the surface of the substrate in an open atmosphere environment thereby increasing the substrate surface energy and improving the adhesion of the metal barrier layer with the substrate, effectively "priming" the substrate for metallization. In one embodiment disclosed herein, a PECVD or CCVD apparatus is integrated "in-line" with a packaging substrate manufacturing line there for priming the substrate for metallization before being wound into a roll.

Various embodiments of the present invention disclosed herein also comprise apparatus and methods for applying a barrier layer to the surface of a packaging substrate at open atmosphere. The apparatus and method disclosed herein provide for the direct combustion of liquids and/or vapors that contain the chemical precursors or reagents to be deposited on to the surface of a substrate material at open atmosphere. Metal oxides, for example, aluminum oxides, are formed from the combustion of materials, such as organo-aluminum compounds with an oxidant, and combusted resulting in a vapor and/or gas at open atmosphere that is directed on to the surface of the substrate and resulting in the deposition of the desired coating thereon.

Figure 2A:
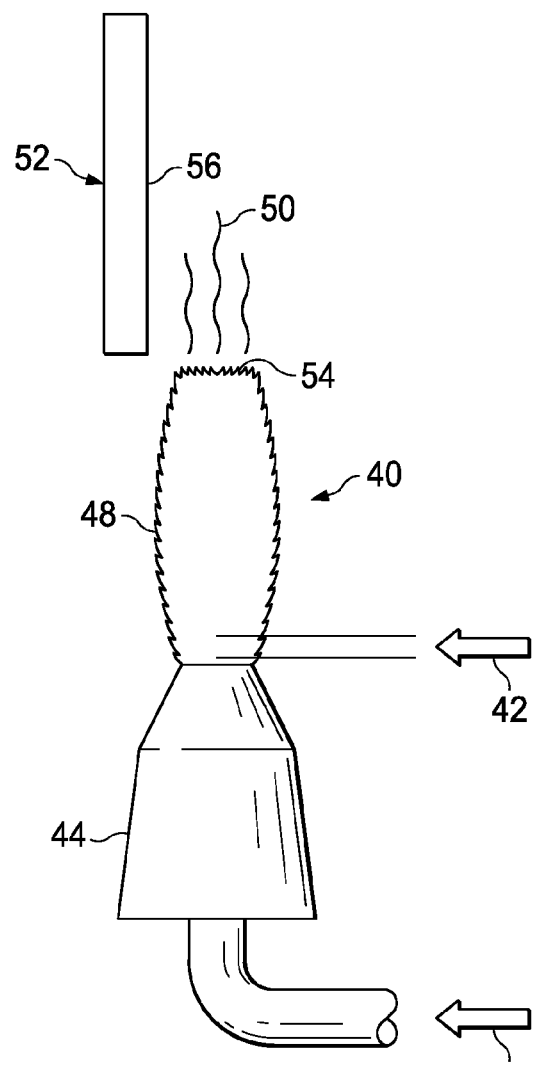
FIGS. 2A-2I depict various embodiments of the apparatus and method employed in the present invention disclosed herein.

In accordance with an embodiment of the invention disclosed herein, FIG. 2A depicts a flame CCVD apparatus that is supplied with combustible chemical precursors for the deposition of an inorganic oxide coating on to a substrate. The system operates to break the chemical precursors into micron and sub-micron sized droplets in the combustion zone for the application of the ultra-thin coating process disclosed herein.

Figure 2B:
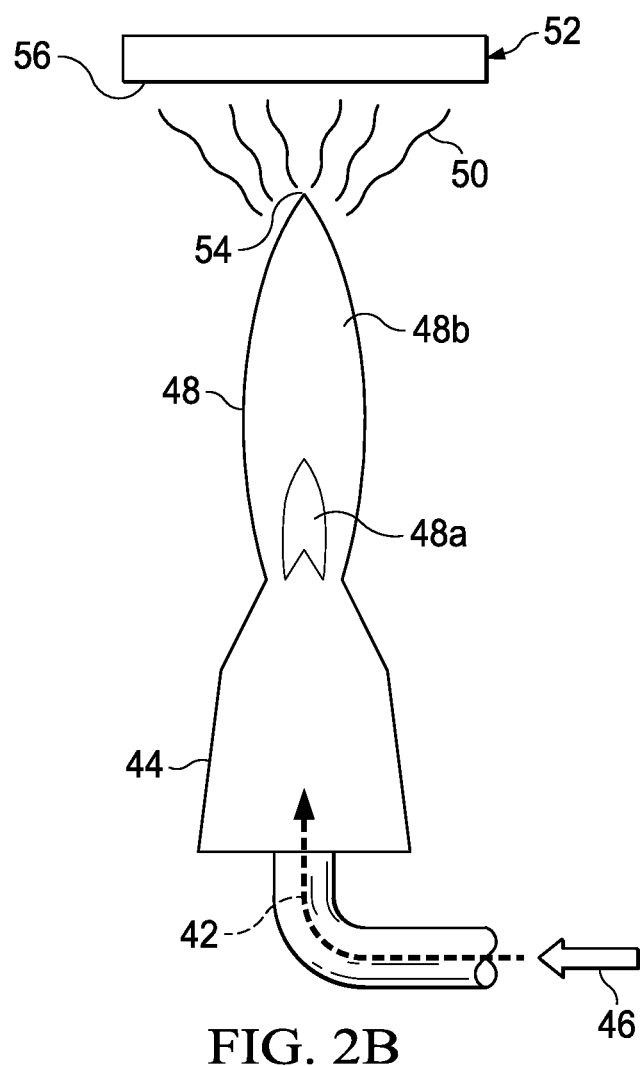

Turning to FIG. 2A, a general schematic of the apparatus 40 that is utilized to carry out the coating deposition process is shown. Chemical precursors 42 may comprise a solvent-reagent solution of flammable or non-flammable solvents mixed with liquid, vaporous, or gaseous reagents supplied to flame head assembly 44 or other flame-producing device. The term "flame head assembly" is used to refer generally to describe any apparatus that is capable of producing a flame from a fuel feed, including flame treaters, flame burners and flame head devices as described herein and which are commercially available from various manufacturers. Chemical precursors 42 are ignited in the presence of an oxidant 46 resulting in a flame 48. As the chemical precursors 42 solution or mixture burn, the reagent reacts to form an inorganic vapor and leaves the flame 48 along with other hot gases 50 and combustion products. The substrate 52 to be coated is located proximal to flame 48 within the region of gases 50. In one embodiment, substrate 52 is oriented tangentially to the flame 48, or as shown in FIG. 2B substrate 52 is oriented obliquely to the flame 48, or at any angle facing the flame end 54 of flame 48 such that the hot gases 50 containing the reagent vapor will contact the substrate surface 56 to be coated. In various embodiments, substrate 52 may consist of a film or composite film comprising oriented polypropylene (OPP), polyethylene (PE), polylactic acid (PLA), polyhydroxy-alkanoate (PHA), polyethylene terephthalate (PETP), other polyesters, or other known polymer, biopolymer, paper or other cellulosic substrates, alone or in combination, as known in the art.

FIG. 2B is similar to the apparatus 40 shown in FIG. 2A, but is configured for a non-turbulent flame methodology, suitable for chemical precursors comprising gaseous precursors 42 and non-flammable carrier solutions 46. Flame 48 produced by the flame head assembly 44a typically has the flame characteristics of an inner flame 48*a* defining the reducing region where the majority of oxidizing gas supplied with the reagent burns and an outer flame 48*b* defining the oxidizing region where the excess fuel oxidizes with any oxidizing gas in the atmosphere. In this example embodiment, the substrate is positioned at an oblique angle proximate to the flame end 54 of the flame 48 such that the hot gases and/or vapors 50 containing the reagent vapor will contact the substrate surface 56 of substrate 52.

Referring back to FIG. 2A, the precursor mixture 46 is supplied to the flame head assembly 44. Oxidant 46 is also supplied to the flame head assembly 44 in some fashion, via a separate feed, or is present in the process atmosphere, or the oxidant may be supplied by a separate feed to the process atmosphere or flame ignition point, or the oxidant may be present in the reagent mixture. In the depicted embodiment, the chemical precursor solution 42 is ignited in the presence of oxidant 46 and combust in flame 48 resulting in the generation of heat, gases and/or vapors 50. The generation of heat causes any liquid reagent solutions present to vaporize and increase the temperature of the substrate 52 so as to result in improved surface diffusion of the coating resulting in a more uniform coating deposited onto the substrate surface 56.

In performing CCVD or PECVD coating deposition on film substrates, certain deposition conditions are preferred. First, the substrate needs to be located in a zone such that it is heated by the flame's radiant energy and the hot gases produced by the flame sufficiently to allow surface diffusion. This temperature zone is present from about the middle of the flame to some distance beyond the flame's end. The temperature of the flame can be controlled to some extent by varying the oxidant-to-fuel ratio as well as by adding non-reactive gases to the feed gas or non-combustible miscible liquids to the feed solution. Secondly, the metal-based precursors need to be vaporized and chemically changed into the desired state. For oxides, this will occur in the flame if sufficient oxygen is present. The high temperatures, radiant energy (infrared, ultraviolet and other radiant energy), and plasma of the flame also aid in the reactivity of precursors. Finally, for single crystal films, the material being deposited should be in the vapor phase, with little or no stable particle deposition. Particle formation can be suppressed by maintaining a low concentration of solutes, and by minimizing the distance, and therefore time, between locations where the reagents react and where the substrate is positioned. Combining these different factors predicts the best deposition zone to be located in proximity of the flame's tip. If a solution is sprayed, droplets can strike a substrate located too far into the flame proximity, possibly resulting in some spray pyrolysis characteristics in the resulting film. In fact, in some configurations, with large droplets or with some reactants, it may be impossible to not have some spray pyrolysis occur.

In various embodiments of the invention disclosed herein, a plasma torch may also be used in a manner similar to a flame apparatus to achieve similar results. Chemical precursors are sprayed through a plasma torch and deposited on to the substrate. The reagents and other matter fed through the plasma torch are heated and, in turn, heat the substrate surface, much in the same manner by the flame embodiment described herein. In plasma enhanced chemical vapor deposition, lower plasma temperatures may be used as compared to conventional plasma spraying, as lower heat is required to cause the chemical precursors to react. As a result, the chemical precursor reactions occur at lower temperatures thereby allowing substrates with low melt points to take advantage of PECVD. The deposition of the coating on to the substrate results from directing of the plasma gas vapor containing the charged ions in the direction of the substrate. For example, a chemical precursor gas mixture or solution is fed into a plasma flame resulting in the formation of a chemical vapor. The chemical precursor solution may comprise inorganic metal oxides such as aluminum oxide or silicon oxide. Once oxidized, the resulting ions in substantially vapor form are directed onto the surface of the substrate resulting in the formation of a solid coating formed on the surface of the substrate and which are typically formed with thicknesses in the 1 to 50 nanometer range.

In general, as long as a flame is produced, CCVD or PECVD can occur independently of the flame temperature or substrate surface temperature. The flame temperature is dependent on the type and quantity of reagent, solvent, fuel and oxidant used, and the substrate shape and material, and can be determined by one skilled in the art when presented with the particular reagent, solvent, fuel, oxidant and other components and conditions for deposition. The preferred flame temperature near the deposition surface on a moving web line is between about 800° C. and 1300° C. As flames may exist over a wide pressure range, CCVD can be accomplished at a pressure from about 10 torr to about thousands of torr, but it is preferred to be at ambient pressure to ease its use on the polymer film processing line. Likewise, if plasma is formed for depositing the coating, the temperature of the plasma can range from about 400° C. to about 1200° C. The temperature of the substrate during the CCVD process also can vary depending on the type of coating desired, the substrate material, and the flame characteristics. Generally, a substrate surface temperature of between about 40° C. and 80° C. is preferred for temperature sensitive polymer films.

The deposition rate of the coating onto the substrate can vary widely depending on, among other factors, the coating quality, the coating thickness, the reagent, the substrate material and the flame characteristics. For example, increasing the exposure period of the film substrate to the vapor stream emanating from a flame head can result in thicker coatings deposited on the film substrate, assuming a relatively constant precursor feed flow rate to the flame generated at the flame nozzle. Less porous coatings are possible assuming a relatively lower feed flow rate to the flame generated at the flame nozzle or more porous coatings assuming a relatively greater feed flow rate to the flame generated at the flame nozzle. Likewise, if a higher quality coating is desired, a longer exposure time at a lower precursor feed flow rate may be necessary, while a gross or textured coating can be produced relatively quickly using a greater precursor feed flow rate. One skilled in the art can determine the precursor feed flow rates and exposure periods necessary to produce a desired coating on the film substrate. Typical deposition rates on product made using the apparatus and methods disclosed herein range from about 10 nm/min to about 1000 nm/min with the film surface being normally exposed to the flame for 0.1 to 10 seconds. As discussed above, the chemical precursor solution in one embodiment is a liquid reagent dissolved in a liquid solvent. However, solid, liquid, vaporous and gaseous reagents can be used, with a liquid or gaseous solvent, as long as the chemical precursor feed to the flame is typically liquid or gaseous in nature.

Figure 2C:
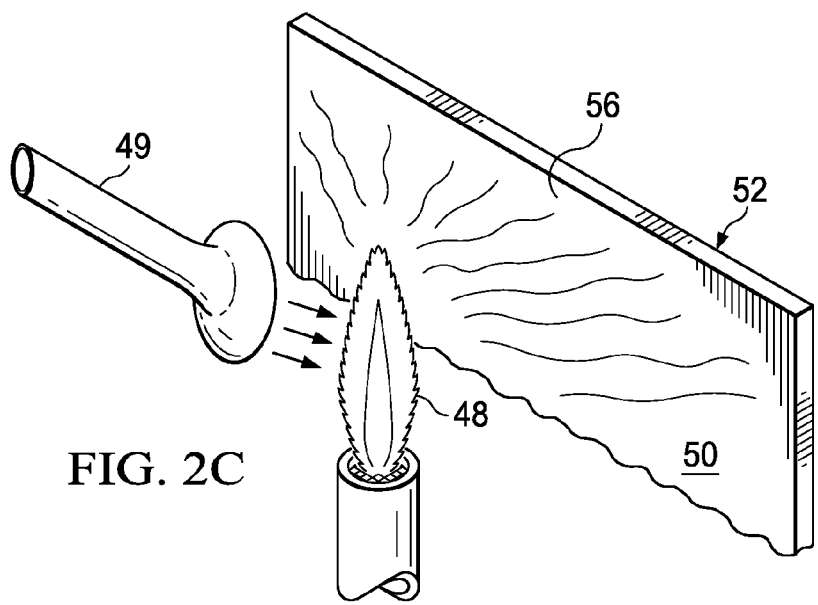

Referring to FIG. 2C, one embodiment of the invention disclosed herein is shown wherein a flame redirect source is shown. The flame redirect technique employs an air knife 49 situated at an angle to the flame 48 to redirect the gases and/or vapors 50 from the process. The air knife 49 directs an air stream into the vapor stream 50 coming from the flame 48. This effectively redirects the vapor stream 50 in the desired direction of the substrate surface 56 while at the same time deflecting the heat stream associated with flame 48 from overheating or melting the substrate 52 being coated with the vapor 50. This method results in the dissipation of heat directed on to the substrate 52 from the flame 48 heat stream thereby resulting in the deposition of desired coating on to the substrate surface 56 at lower temperatures.

The redirect flame embodiment also acts to disperse the gas and/or vapor stream 50 emanating from the flame 48 resulting in a wider deposition stream 50 being directed on to the substrate surface 56 and enlarging the coating area of same. In an alternative embodiment, an electromagnetic or "electro-redirect" method may be employed to redirect the deposition of ions and/or particles emanating from a flame and/or plasma source on to the substrate surface. In this embodiment, the flame and/or plasma source initially directs the ion and/or particle stream and any associated heat in a substantially parallel direction to the film substrate to be coated. A field with an electrical potential is generated by means as is known in the art that passes through a portion of the film substrate resulting in the redirection and/or acceleration of the ion and/or particle stream emanating from the flame or plasma source on to the film surface. The chemical bonds within the polymer molecules are more readily broken which results in the rapid formation of free radicals. This results in the deposition of the desired ultra-thin coating on to the film surface without the associated heat being transferred to the film surface thereby preventing potential melting of the film substrate during the deposition process.

Figure 2D:
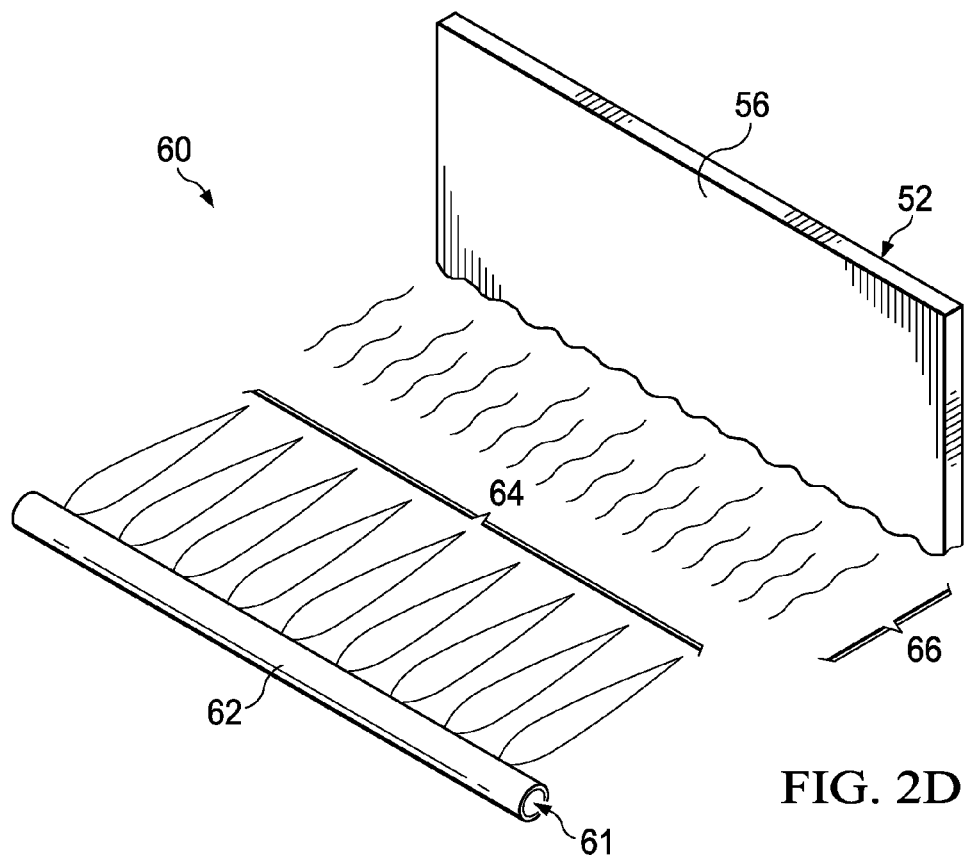

With reference to FIG. 2D, one embodiment of the invention disclosed herein is shown with multi-flame head system 60. In this embodiment, system 60 includes a flame head assembly 62 comprising a pipe with spaced holes or nozzles for emitting flames and referred to as flame heads 64 integrated therewith. In various embodiments, such flame head assembly 62 may comprise commercially available flame burner heads manufactured by Flynn Burner Corporation of New Rochelle, N.Y. Chemical precursors 61, which may also include an oxidant, are fed into flame head assembly 62 and when ignited result in lit flames emanating from flame heads 64 resulting in the generation of hot gases and/or vapors 66. The substrate 52 to be coated is located proximal to flame heads 64 within the region of hot gases and/or vapors 66, such that hot gases and/or vapors 66 containing the reagent vapor will contact the substrate surface 56 resulting in a coating deposited thereon. The multi-head flame head deposition system 60 improves the continuity and thickness of coating deposition across the substrate surface 56 as the hot gas and/or vapor region 66 is expanded by the use of multiple flame sources. System 60 depicted in FIG. 2D is shown with flame head assembly 62 aligned with multiple flame heads positioned in a planar and/or linear orientation. However, other embodiments are contemplated wherein one or more flame head assemblies may be designed in various two-dimensional and three-dimensional geometries such as square, rhomboid, cylindrical shapes which may be fashioned and positioned relative to the film being processed according to the necessity of the user as depicted in FIGS. 2E, 2F, 2G, 2H and 2I. In these alternative contemplated embodiments, one or more precursor(s) may be fed to select flame heads in the individual flame head assembly providing the user with the ability to vary the type, characteristics and thickness of the coating deposited on to a substrate. As can be readily seen in these figures, the shape of the individual flame heads and flame head assemblies and their orientation relative to the substrate may be configured to achieve differential types, concentrations and/or thicknesses of ultra-thin coating deposition on to the substrate by the apparatus and methods described herein.

Figure 2G:
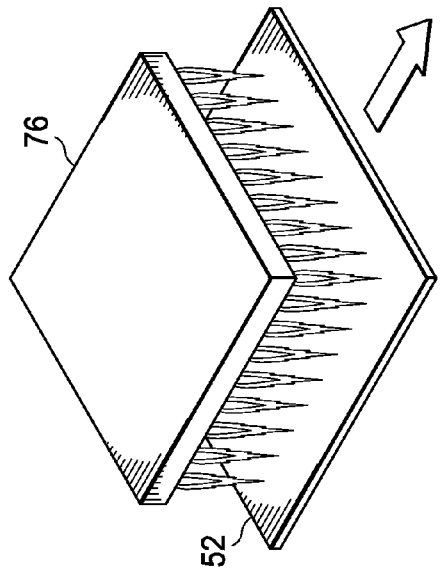
Figure 2F:
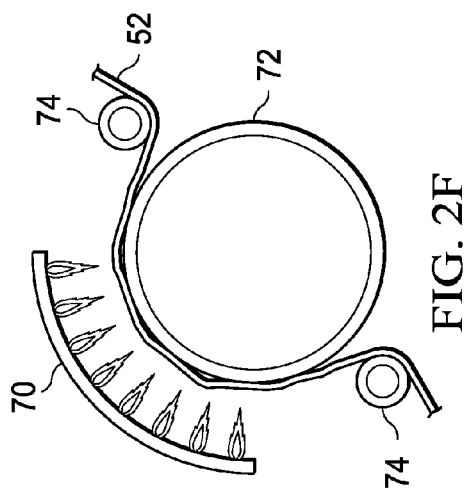
Figure 2E:
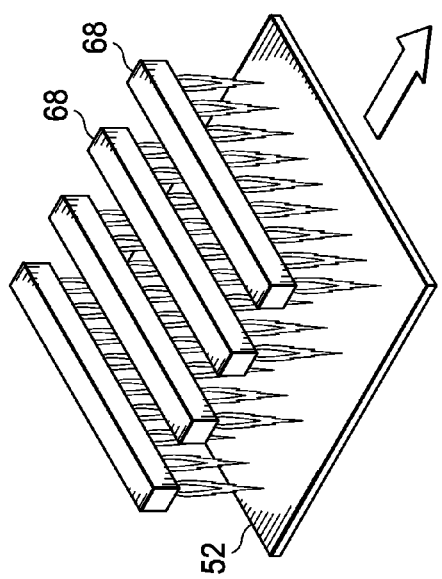

For example, FIG. 2E discloses multiple flame head assemblies 68 oriented in parallel rows perpendicular to the direction of the packaging substrate 52 movement. By orienting the flame head assemblies 68 in this fashion, multiple coatings may be deposited on the substrate 52 in one pass along the indicated direction of substrate 52 travel. In one embodiment, various concentrations, gradients of precursor concentrations or different precursors may be fed to each individual flame head assembly 68, or to each individual flame head integrated into each flame head assembly 68 to vary the type of coating layers and/or concentration of coating layers and/or thickness of coating layers deposited on to substrate 52. In one embodiment, one or more of the flame head assemblies 68 emit a flame for purposes of priming the film substrate 52 via flame treatment. After passing through the flame treatment flame head assemblies, the substrate encounters one or more of the latter positioned flame head assemblies 68 which may be supplied with a precursor or various precursors for application of an ultra-thin coating on the flame-treated substrate 52 as desired by the user.

FIG. 2F discloses a curved flame head assembly 70 that provides for deposition of an ultra-thin inorganic oxide layer on to a substrate 52 as it passes over a portion of chill roll 72 and is held in relative contact with chill roll 72 via placement of nip rollers 74. In one embodiment, various concentrations, gradients of precursor concentrations or different precursors may be fed to the curved flame head assembly 70, or to each individual flame head integrated into the curved flame head assembly 70, to vary the type of coating layers and/or concentration of coating layers and/or thickness of coating layers deposited on to substrate 52.

FIG. 2G depicts a square or rectangular shaped flame head assembly 76 that provides for deposition of an ultra-thin inorganic oxide layer on to substrate 52. In one embodiment, various concentrations, gradients of precursor concentrations or different precursors may be fed to the flame head assembly 76, or to each individual flame head integrated into the flame head assembly 76, to vary the type of coating layers and/or concentration of coating layers and/or thickness of coating layers deposited on to substrate 52.

Figure 2H:
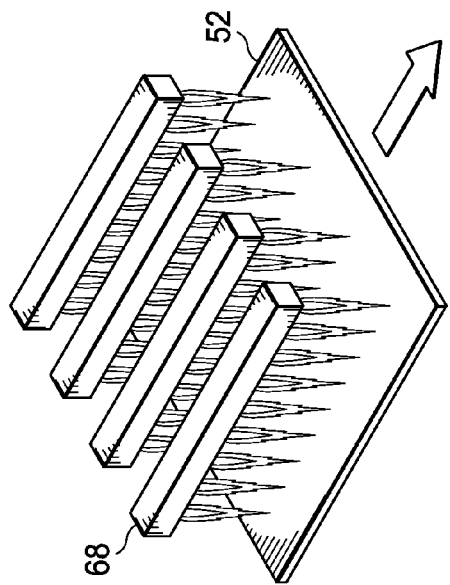

FIG. 2H discloses multiple flame heads integrated into flame head assemblies 68 oriented in parallel rows parallel to the direction of the packaging substrate 52 travel. In one embodiment, various concentrations, gradients of precursor concentrations or different precursors may be fed to each individual flame head assembly 68, or to each individual flame head integrated into each flame head assembly 68 to vary the type of coating layers and/or concentration of coating layers and/or thickness of coating layers deposited on to substrate 52.

Figure 2I:
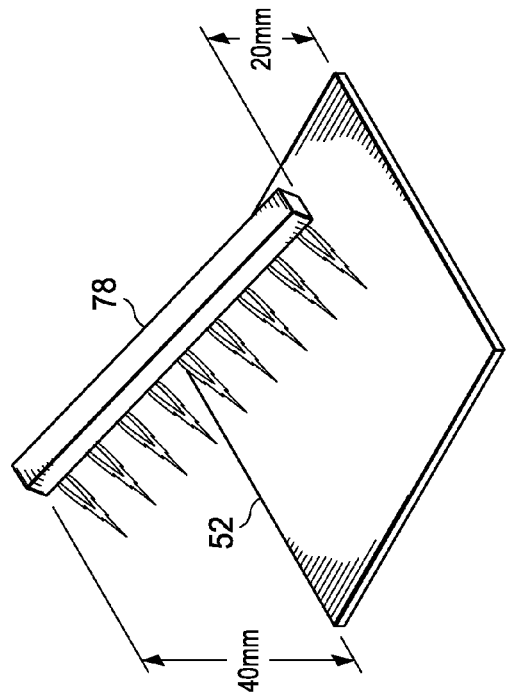

Turning to FIG. 2I, one embodiment of the invention disclosed herein depicts a flame head assembly 78 oriented at an angle relative to the substrate 52 surface. In this configuration, one end of the flame head assembly 78 is closer to the substrate surface as the substrate 52 moves in the longitudinal direction parallel to the flame head assembly 78. In one embodiment, the "lower" end of the flame head assembly 78 is positioned at substantially 20 mm above the surface of substrate 52 and serves to precondition the substrate 52 as it provides a more intensive heat treatment upon introduction of the substrate 52 to the proximity of flame head assembly 78 and would serve to clean off dirt, dust and other contaminants that may be on the substrate surface. As the substrate 52 moves along, the "upper" end of the flame head assembly 78 is positioned substantially 40 mm above the surface of substrate 52 and resulting in lower intensity heat treatment applied to the substrate 52 due to the increasing distance between the surface of substrate 52 and the flame head assembly 78. Therefore, various concentrations of precursor could be fed to select or all of the remaining flame heads in the flame head assembly 78 resulting in the differential application of inorganic oxide layers to the surface of substrate 52 as it moves along the length of the flame head assembly 78. In one embodiment, the flame head assembly 78 is oriented at a 2 mm distance from the substrate 52 surface at the initial encounter between the flame/plasma with the substrate 52 surface and oriented at an inclined angle to produce a 4 mm distance between the substrate 52 and the last flame head in the flame head assembly 78 as shown. In alternative embodiments, the flame head assembly 78 may be oriented at inclined angles perpendicular or along a radial arc relative to the direction of the substrate 52 to achieve flame pretreatment or variegated organic oxide layer deposition on the substrate 52 as desired.

Such configurations and shapes would increase the film surface area exposed to the flame in a single pass of the film substrate past the burner. In turn, these geometric configurations increase the dwell time the flame or plasma has in contact with the film substrate surface thereby altering the coating properties imparted to the film substrate. Therefore, the embodiments depicted herein are not to be construed as limiting to the disclosure herein.

Figure 3B:
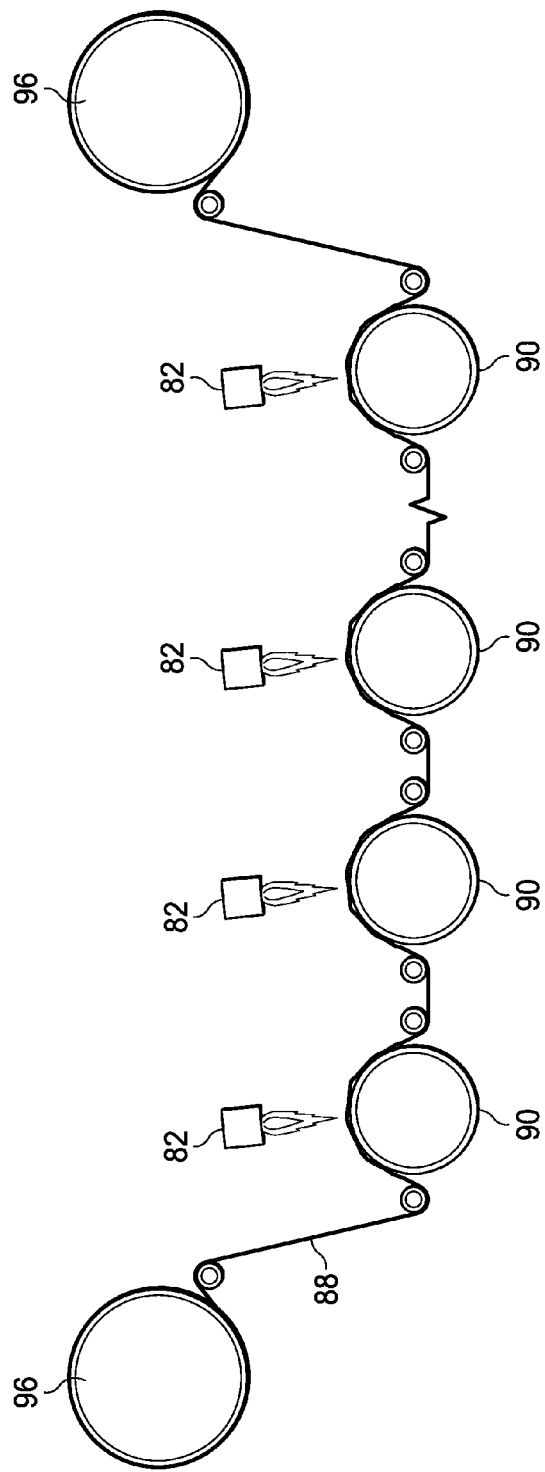

Turning to FIG. 3A, one embodiment of a CCVD and/or PECVD coating assembly as described herein is shown "in-line" with a roll-to-roll winding/coating assembly 80 in a typical manufacturing context. In the depicted embodiment, an unwinding unit 86 unwinds film 88 from roller 96 as winding unit 84 winds film 88 on to winding core 94. A flame chamber 82 housing a CCVD and/or PECVD coating assembly 92 as described herein is integrated in-line with the unwinding/winding units 86 and 84. The flame chamber 82 constitutes an unpressurized enclosure in which at least one CCVD and/or PECVD flame head assembly 92 is housed for the safety of the user and surrounding equipment and materials. During the unwinding/winding process, a film substrate 88 is drawn from unwinding unit 86 through various rollers and on to drum 90. After receiving a coating and exiting the flame chamber 82, film substrate 88 is wound around winding core 94. Drum roller 90 rotates and winds and/or draws substrate 88 in proximity to the hot gases and/or vapors generated by the flame head assembly 92. In the depicted embodiment, drum roller 90 is positioned above flame head assembly 92 so as to maximize the surface area contact between the rising hot gases and/or vapors generated by flame head assembly 92 thereby resulting in efficient deposition of the coating material carried by the hot gases and/or vapors on to substrate 88. In various contemplated embodiments, drum roller 90 may comprise a temperature control roll or "chill roll" so as to impart a thermal temperature to the substrate and a differential between the substrate 88 to be coated and the heat generated by the flame head assembly 92 which would facilitate coating substrates with low melt points without heat damage to the substrate according the inventive method and apparatus disclosed herein. In the embodiment depicted in FIG. 3B, multiple flame assemblies 82 are integrated in-line to provide multiple coating layers to the substrate 88. In this configuration, multiple layers of ultra-thin inorganic coatings of variable type, concentration and/or thickness may be applied to the substrate at each flame head assembly 82 station as desired and configured by the user.

With reference to FIGS. 3A and 3B and without being bound by theory, it has been discovered that better quality deposition coatings (i.e. improved coating layer coverage uniformity over the substrate surface and enhanced RMS smoothness of the deposited coating layer) may be achieved by passing the substrate film multiple times through the flame treatment system or past multiple flame heads and/or flame head assemblies, with low concentrations of precursor, as opposed to a single pass of the substrate through a flame treatment system using a high concentration of precursor resulting in one thick deposition layer. In one example embodiment, a stand alone roll-to-roll coater was equipped with a single burner plasma flame treatment system. A combustible inorganic precursor, tetraethyl orthosilicate (TEOS), was metered into the fuel stream at a controlled rate. As the film was unwound and passed over the plasma flame, low concentration levels of silica were deposited onto the surface of the film substrate. Collected data revealed that the $SiO_2$ deposition quality was poor where the TEOS concentration was greater than 22 mg/min, $SiO_2$ deposition quality was rated as good where the TEOS concentration was less than 11 mg/min, and $SiO_2$ deposition quality was rated as excellent where the TEOS concentration level was less than 2 mg/min. As the film was passed multiple times (between two to five passes) over a plasma flame fed with low concentration TEOS, multiple layers of $SiO_2$ were deposited on the film substrate which resulted in the development of a barrier layer with a thickness of 50 nm and exhibiting an OTR<10 $cc/m^2$/day and a WVTR<0.5 $g/m^2$/day.

The metallization primer process described herein may be conducted either during ("in-line") or after film manufacturing. The film surface manufacture in-line is commonly pristine and free of contaminants thereby making it ideal for surface priming due to the challenges of keeping the film surface clean after the manufacturing process is complete. For example, dust, anti-block particles, or additives in the polymer film may "bloom" to the surface of the film substrate in a post-manufacturing environment. These conditions can make it difficult to achieve a uniform primer coating during the priming process conducted after the film has been manufactured and stored for a period of time. Blooming additives can also migrate over the inorganic nanolayer, as it is not a barrier layer in itself, thus it is desired not to have these additives in the film.

Figure 3C:
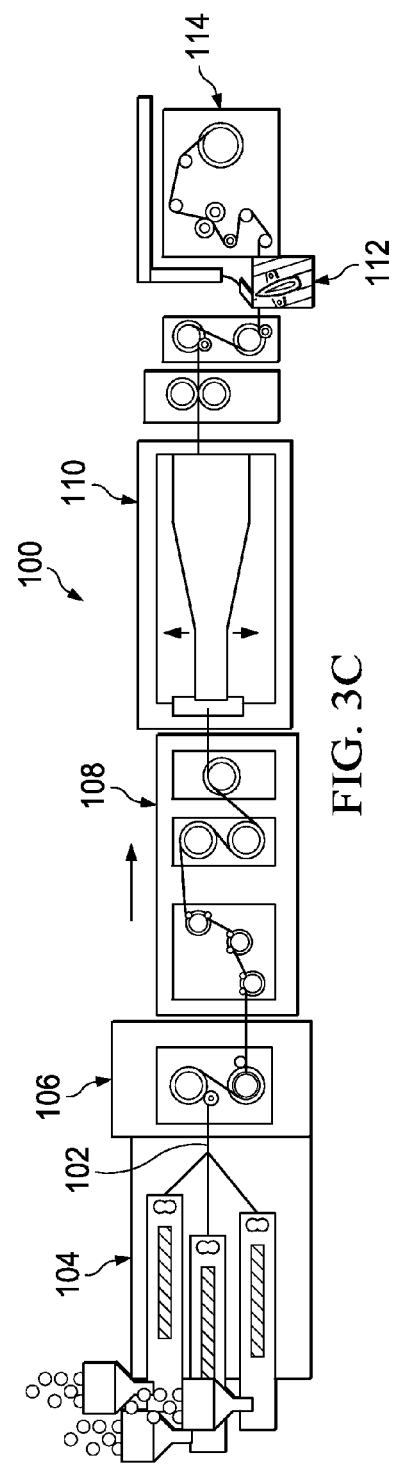

Turning to FIG. 3C, one embodiment of the invention disclosed herein is shown wherein a flame CCVD or PECVD unit is installed in-line with a biaxial film substrate production line 100. In the depicted embodiment, a biaxial film substrate 102 is formed by an extrusion unit 104. The film substrate 102 is then passed through a cooling unit 106 and is stretched in the machine (longitudinal) direction in machine stretching unit 108 and in the transverse direction in transverse stretching unit 110. The film substrate is then passed through the flame head assembly 112 wherein it is coated with the desired inorganic primer and/or barrier coating according to the apparatus and processes described herein. The coated film substrate is then wound into a transportable roll in winding unit 114 for further processing or distribution.

Figure 3D:
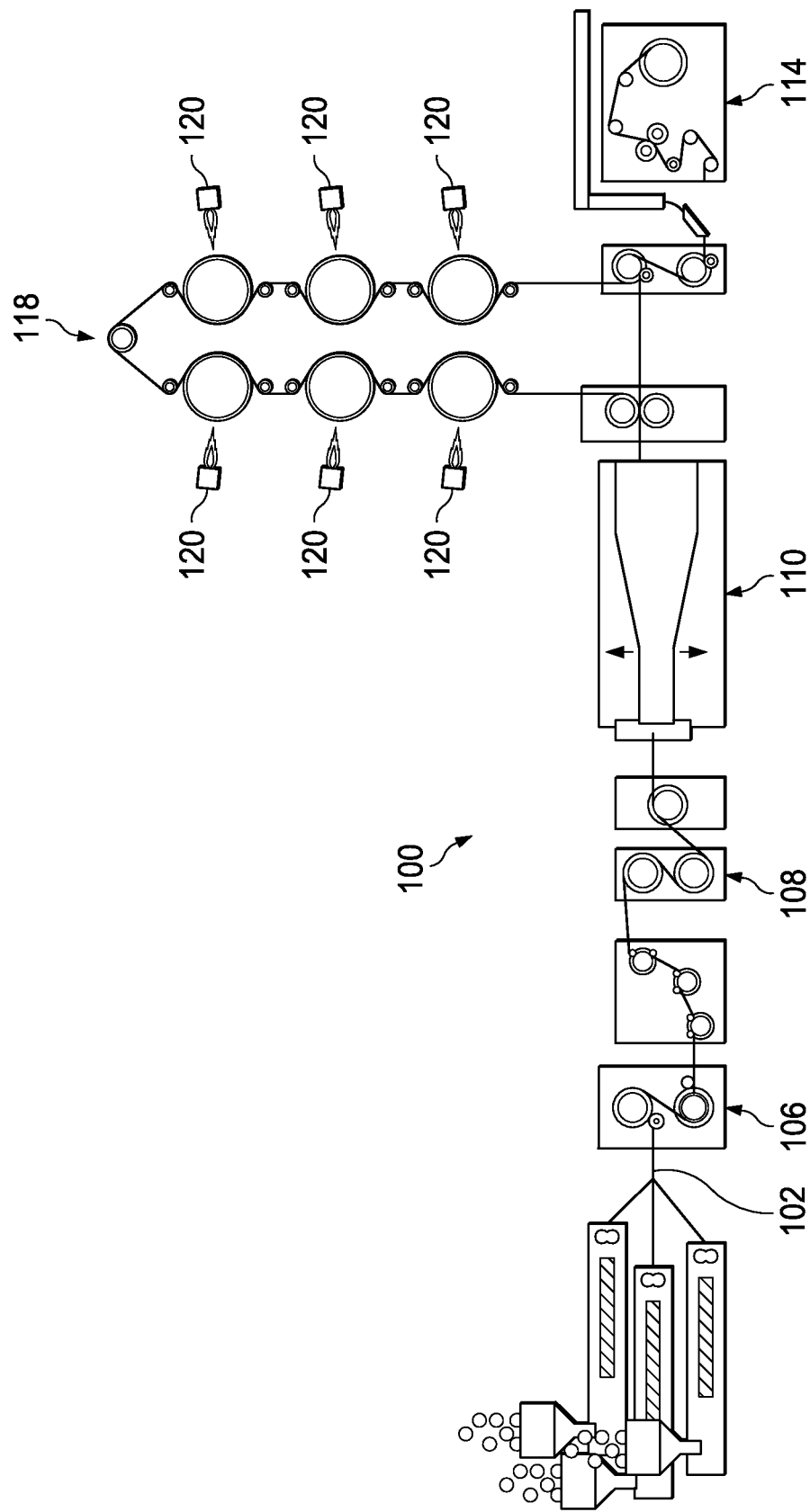

With reference to FIG. 3D, an embodiment of the invention disclosed herein is depicted wherein a flame CCVD or PECVD coating tower unit 118 is installed in-line with a biaxial film substrate production line 100 as similar to the production line depicted in FIG. 3C. In this embodiment, multiple flame head assemblies 120 are placed in series with each delivering a low concentration of inorganic precursor as the substrate 102 passes through the line over various chill rolls and nip rolls in a single pass through the system. The flame head assembly geometry, substrate line speed, chill roll temperature and precursor types and concentration could be configured in various contexts to produce the desired type, concentration and/or thickness(es) of ultra-thin inorganic coating(s) to be deposited on the particular packaging substrate. Typical processing conditions are as follows: line speeds from 200 to 1500 ft/min (60 m/min to 450 m/min); chill roll temperatures of 40 to 80° C.; the flame pretreatment with burner to film distance of 5 mm for flame pretreatment, a fuel to air ratio of 0.90 to 0.95 for the flame treatment step, a natural gas flow rate of 100 liters/min for a 1 meter wide line; the deposition step with burner to film distances of 5 to 45 mm, a fuel to air ratio 1.0, gas flow rates of 70 to 105 liters/min for a 1 meter wide line, a precursor concentration of 0.0001 mole % to 0.01 mole % of the gas stream. The plasma temperatures have exhibited good results at 1200° C. with a range covering 650° C. to 1450° C. The above conditions will produce a coating with a WVTR of <0.2 g/m$^2$/day and an OTR<20 cc/m$^2$/day.

Figure 3E:
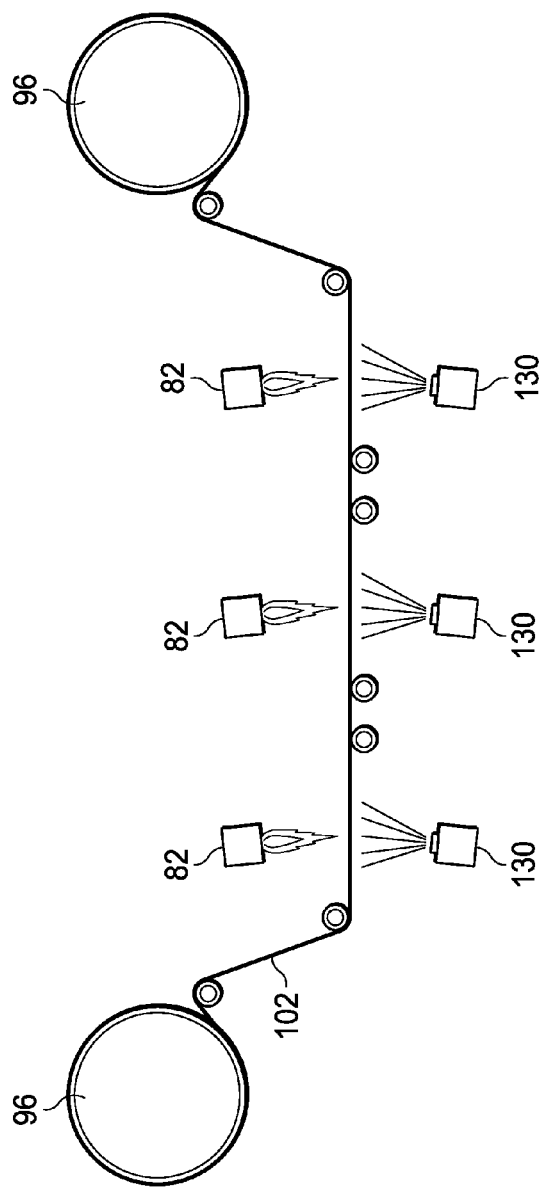

Managing heat buildup in the substrate from exposure to PECVD or CCVD flame head is of great concern as such heat buildup will distort or melt the substrate being coated. As described in various embodiments shown and disclosed herein, chill roll technology is used to dissipate heat buildup in the substrate. However, the diameter of the chill roll or number of multiple chill rolls required to accomplish certain coatings may be cost or space prohibitive due to size/space limitation in the manufacturing environment. Alternatively, spray coolants may be utilized to dissipate heat buildup in the substrate as it is treated according to the apparatus and methods herein that are practiced in limited space environments. As depicted in FIG. 3E, one embodiment of the invention disclosed herein depicts an "off line" inorganic coating deposition apparatus that could be used to coat a substrate produced at a different facility. For example, in one embodiment the equipment design shown in FIG. 3E may be incorporated into a stand-alone process step at a converter. In this embodiment, a packaging substrate 102 is unwound from unwind roll 96, passed over a series of flame head assemblies 82 which may flame treat and/or deposit an ultra-thin coating(s) on to the exposed surface of the substrate 102, while concurrently the opposite exposed surface of the substrate 102 is being cooled with spray coolant from coolant nozzles 130 to dissipate heat and control or prevent degradation or melting of the substrate 102. In this embodiment, chill rolls or other thermal applicators are not required to keep the substrate 102 from degrading or overheating due to the thermal inputs from exposure to the burners 82. The flame head assembly geometry, substrate line speed, coolant spray temperature and precursor concentration could be configured in various contexts to produce the desired thickness(es) of ultra-thin coating(s) to be deposited on the particular packaging substrate. Industrial spray coolants that may be utilized in this embodiment may include aromatics, silicate-ester (COOLANOL 25R), Aliphatic (PAO), silicone (SYLTHERM XLT) or others as known in the art. Typical processing conditions are as follows: line speeds from 200 to 1500 ft/min (60 m/min to 450 m/min); chill roll temperatures of 40 to 80° C.; the flame pretreatment with burner to film distance of 5 mm for flame pretreatment, a fuel to air ratio of 0.90 to 0.95 for the flame treatment step, a natural gas flow rate of 100 liters/min for a 1 meter wide line; the deposition step with burner to film distances of 5 to 45 mm, a fuel to air ratio 1.0, gas flow rates of 70 to 105 liters/min for a 1 meter wide line, a precursor concentration of 0.0001 mole % to 0.01 mole % of the gas stream. The plasma temperatures have exhibited good results at 1200° C. with a range covering 650° C. to 1450° C. The above conditions will produce a coating with a WVTR of <0.2 g/m$^2$/day and an OTR<20 cc/m$^2$/day.

It should be noted that the embodiments shown in FIGS. 2A-3E and FIGS. 5A-5I may utilize plasma-enhanced chemical vapor deposition (PECVD) apparatus and methods to accomplish the coating process as described herein. As such, the depicted embodiments are not be construed as being limited to flame CCVD methods. Whenever the term "flame" or its analogues such as "flame head" or "flame head assembly" are used herein, it is interpreted as including "plasma" and its analogues, and equivalent laser ablation equipment. The plasma may be manipulated by an electromagnetic field in proximity to the plasma source so as to direct the ions generated from the plasma reaction on to the substrate surface to be coated. Thus CCVD is not limiting to the product made, but is just one enabling method used to accomplish making of the described product on the film fabrication line. As previously described herein, alternative embodiments of the apparatus and systems disclosed in FIGS. 2A-3E may be independently be configured to provide flame treatment of the substrate, to apply a primer coating and/or to apply barrier coatings at open atmosphere to the substrate as it moves along the manufacturing line.

Figure 4:
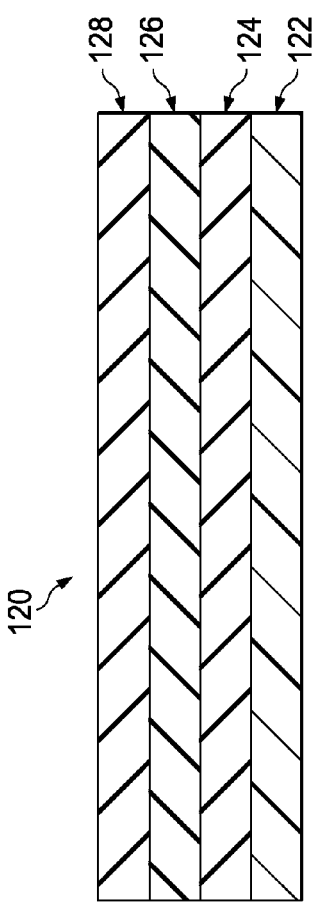
FIG. 4 is a cross-sectional depiction of a film substrate with multiple coating nanolayers according to one embodiment of the invention disclosed herein.

FIG. 4 is a structural diagram depicting an embodiment of a coated substrate 120. In the depicted embodiment, a film or paper substrate 122 is primed with a pure or substantially pure silica layer 124. The substrate 122 with silica layer 124 is then coated with additional oxide layer 126 and a subsequent metal or oxide layer 128. Oxide layers 126, 128 may be comprised of silica mixed with an additional chemical additive or "dopant" for purposes of enhancing the reactivity of the primed surface 124 with additional desired coatings. In one embodiment, the metal barrier layer deposited by the apparatus and method described herein has a thickness between 5 and 50 nm, with an optical density of over 30%. The metal barrier layer may comprise aluminum, copper, iron, manganese, zinc and/or other metals as dictated by the needs of the user. In other embodiments, layer 128 is an oxide layer deposited via CCVD or layer 128 is a metal layer deposited by conventional vacuum metallization technology.

Figure 5A:
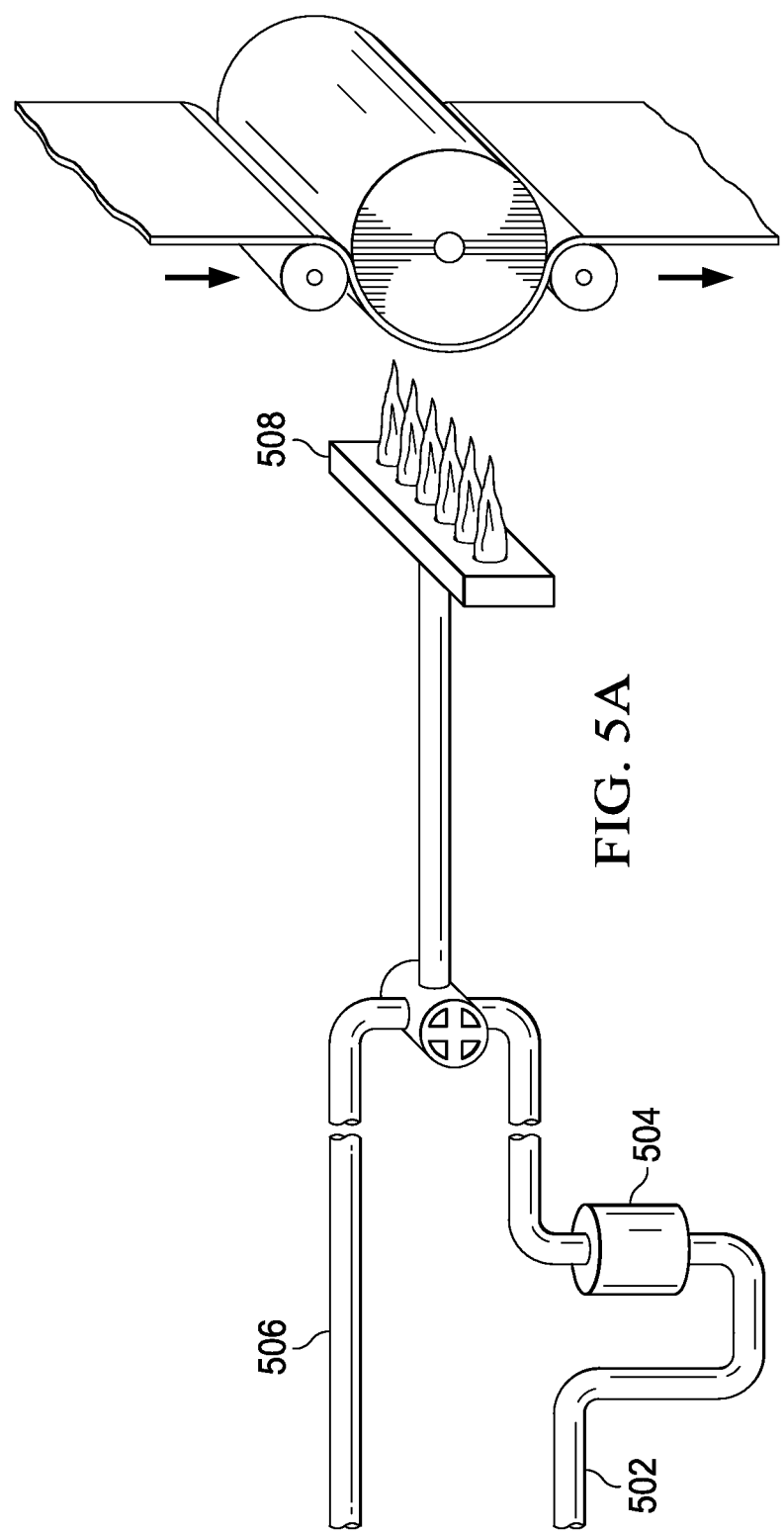
Figure 5B:
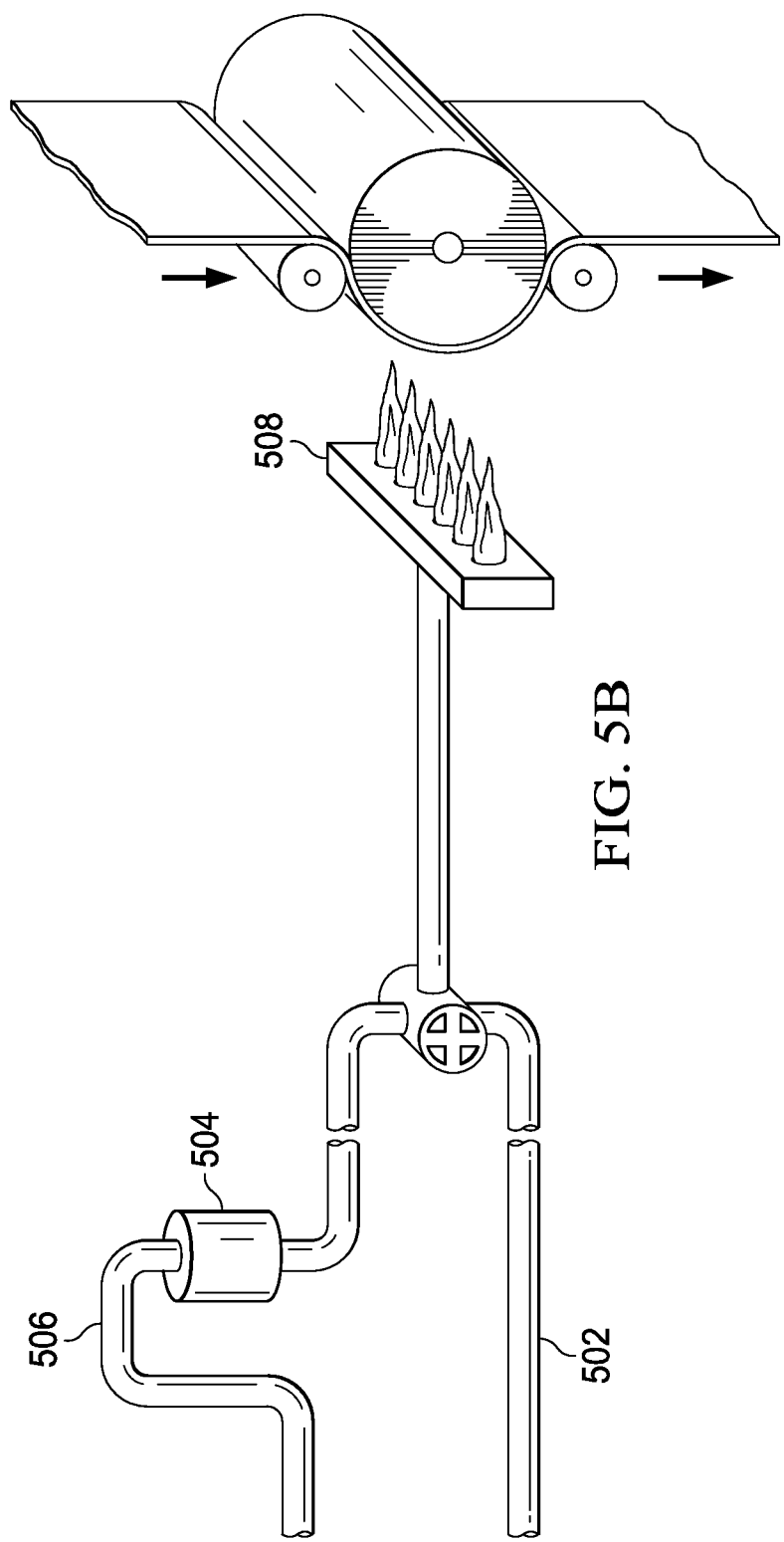
Figure 5C:
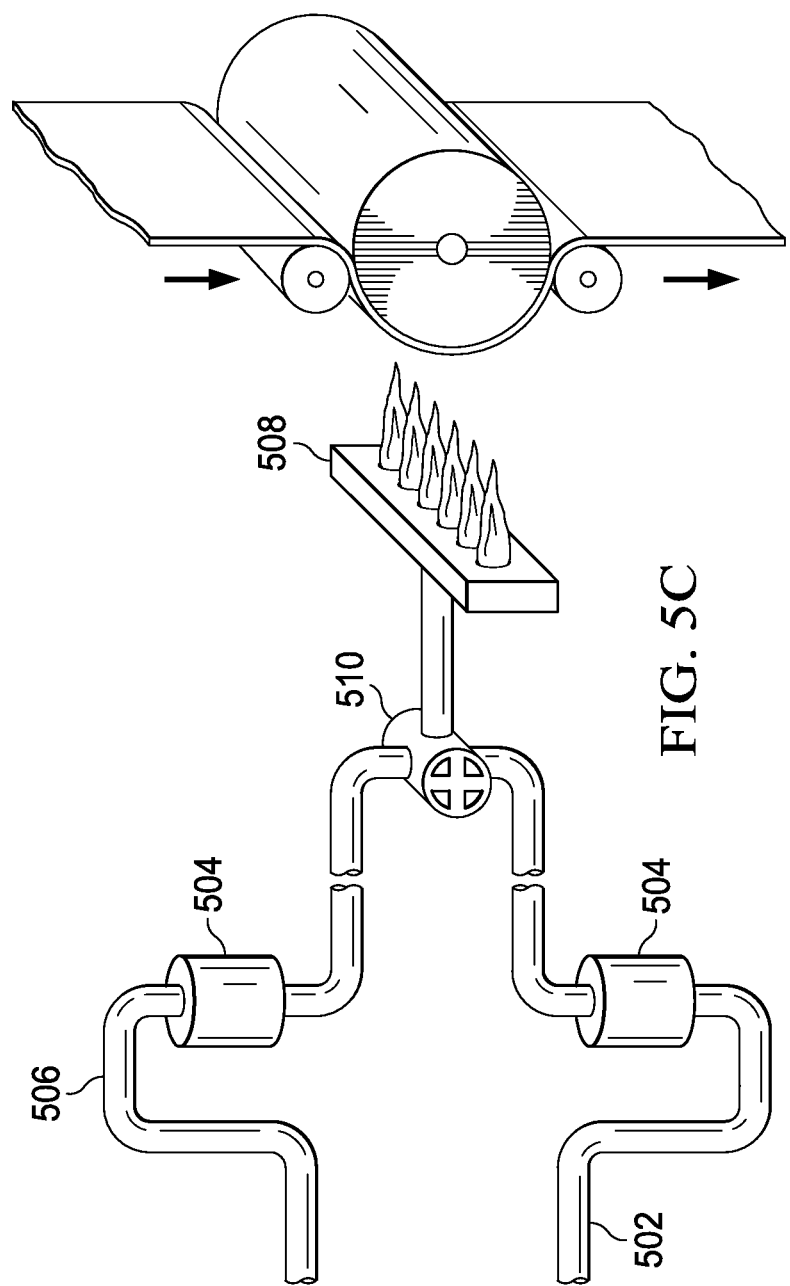
Figure 5E:
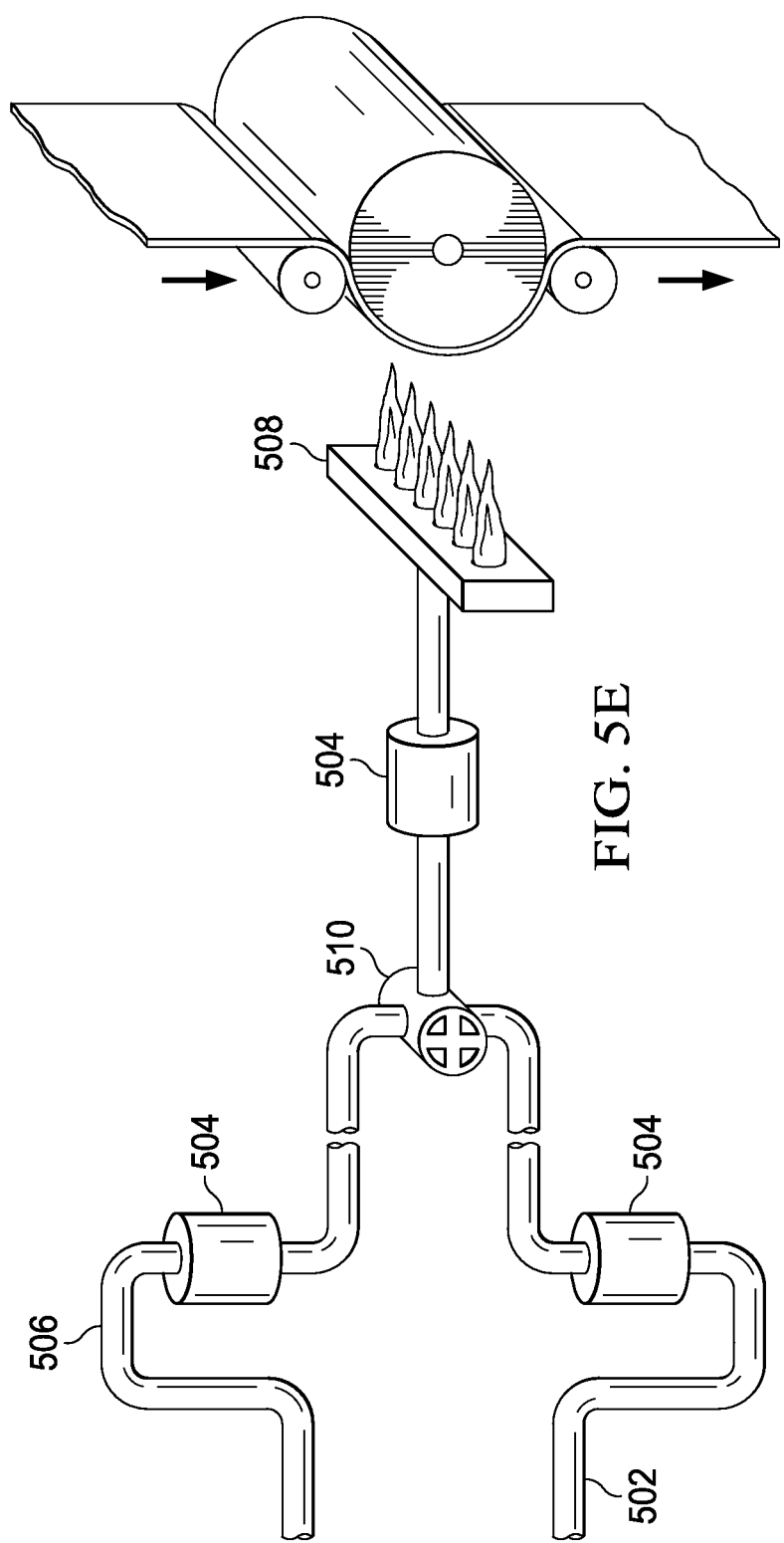
Figure 5H:
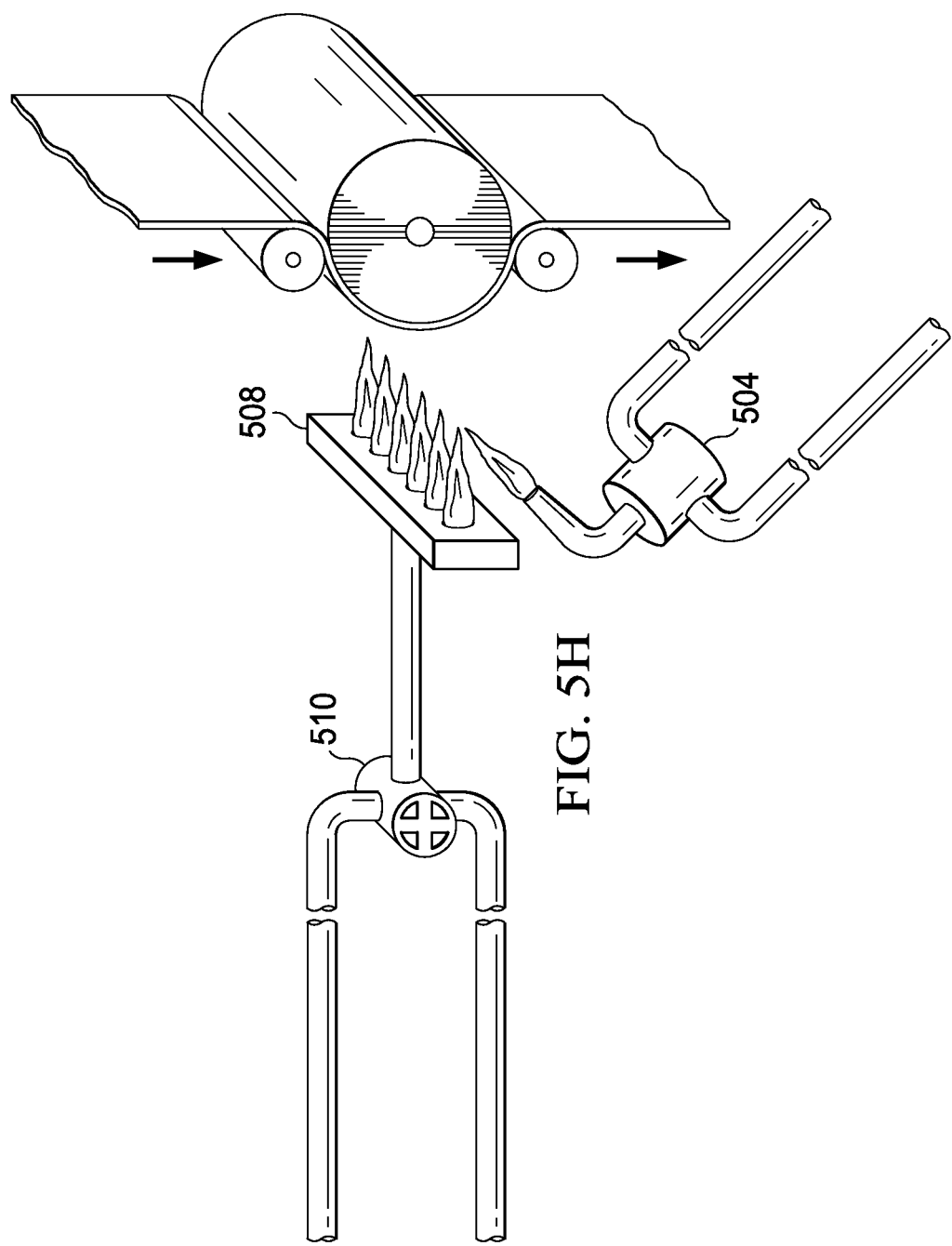
Figure 5I:
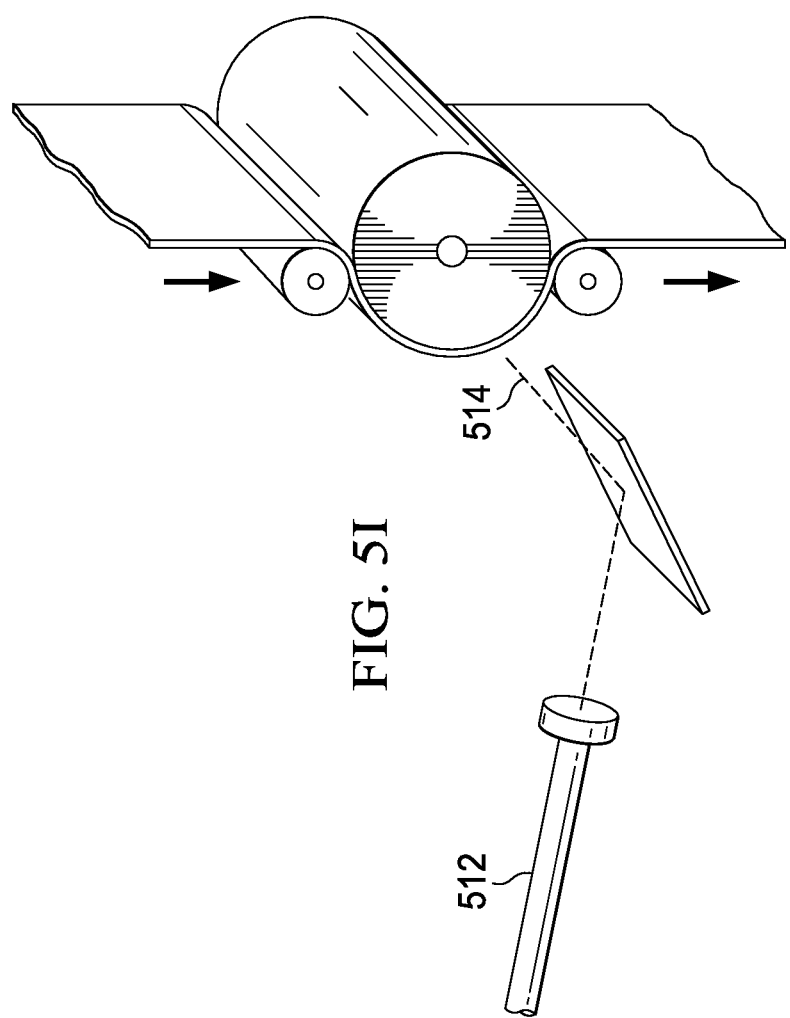

FIGS. 5A-5I depict various apparatus in which various embodiments of the invention disclosed herein may be configured as desired by the user. FIG. 5A discloses a configuration wherein the chemical precursors 504 are fed into the flame fuel line 502 prior to being mixed with air from the air line 506 and combusted at the flame head 508 as shown. FIG. 5B depicts a configuration wherein the chemical precursors 504 are fed into the air line 506 prior to being mixed with fuel from the fuel line 502, which in this embodiment is natural gas, and combusted at the flame head 508 as shown. FIG. 5C discloses a configuration were chemical precursors 504 are fed into an air line 506 and a fuel line 502 prior to being mixed at a fuel/air mixer 510 and combusted at the flame head 508 as shown. In this embodiment, different chemical precursors may be utilized and fed into the air line and fuel line prior to mixing at the fuel/air mixer. FIG. 5D discloses wherein a chemical precursor is introduced after the fuel and air constituents have mixed at the fuel/air mixer as shown. The resulting mixture is then combusted at the flame head as described herein. FIG. 5E discloses a configuration wherein one or more chemical precursors may be mixed at the fuel/air mixer prior to the introduction of an additional chemical precursor downstream and which is thereafter combusted at the flame head as shown. FIG. 5F discloses a configuration where the chemical precursor is introduced at the point where the fuel and air are mixed. The resulting mixture is then combusted at the flame head as described herein. FIG. 5G discloses a configuration wherein the chemical precursor is sprayed or otherwise injected into the existing flame produced by the flame head as shown. FIG. 5H discloses a configuration where in the chemical precursor is combusted into the flame head burner as shown. FIG. 5I discloses a configuration wherein a laser ablation apparatus 512 is used to generate the vapors and/or ion stream 514 which is directed to a substrate for coating thereon. In the embodiments disclosed in FIGS. 5A-5I, it will be evident to one of ordinary skill in the art that various fuel, air and chemical precursor species may be utilized to generate the desired coatings upon the film substrate passing in the desired proximity of the flame head as described herein. The various embodiments shown in FIGS. 5A-5I may be integrated into the various in-line and standalone film substrate manufacturing and processing environments as disclosed herein.

To describe certain embodiments of the inventive apparatus and methods disclosed herein, the following examples are provided. Once having understood the examples set forth herein, one of ordinary skill in the art should be able to apply the apparatus and methods disclosed herein to other chemical deposition methods, and such applications are deemed to fall within the scope of the invention disclosed herein. The following examples are for illustrative purposes and are not to be construed as limiting the scope of the invention. In the examples, the primer coating deposition was performed using CCVD in an open atmosphere environment. The chemical precursors consisted of TEOS in a methane air feed through a film flame treater with a flame temps of 800° C. to 1200° C. unless otherwise indicated.

Example 1

SiO$_2$ Deposition on OPP Polymer by Roll Coater

As an example and for comparative purposes, a biaxially oriented OPP polymer film substrate was flame treated first on the inside surface of the roll. Conditions for the flame treatment of film include: line speed of about 184 feet/min, a burner to film distance of about 5 mm, and a fuel to air ratio of about 1.0. Following flame treatment step, the film was run through the roll coater a second time to deposit a silica layer. Conditions for the silica layer deposition include: line speed of about 184 feet/min, a burner to film distance of about 5 mm, and a fuel to air ratio of about 1.0, TEOS concentration of about 0.00379 mole percentage for both of the flame treatment and silica deposition runs.

The deposition of silica is greatly enhanced by the flame treatment step prior to the treatment with silica. This is demonstrated in FIG. 6 for a single deposition pass of silica via information collected by XPS. The amount of silica, as determined by signal strength, has a 70% increase in silica deposited. Signal without flame pretreatment is 290 counts per second (CPS) at a peak maximum, while the max signal is 500 counts per second for a single pass of silica after flame treatment. In other words, the silica content increased from 0.18 atomic % silicon without flame pretreatment to 0.23 atomic % silicon.

The pretreatment was so successful that multiple laps of silica were deposited after a flame pretreatment was utilized. This is shown in FIG. 7 for signal strength (CPS) vs. binding energy (eV) from XPS. The amount of silica increase during each pass, as can be clearly seen. In terms of atomic % of silicon present, 1, 2, and 3 deposition passes of silica result in 0.23%, 0.26%, and 0.44%, respectively.

Figure 8:
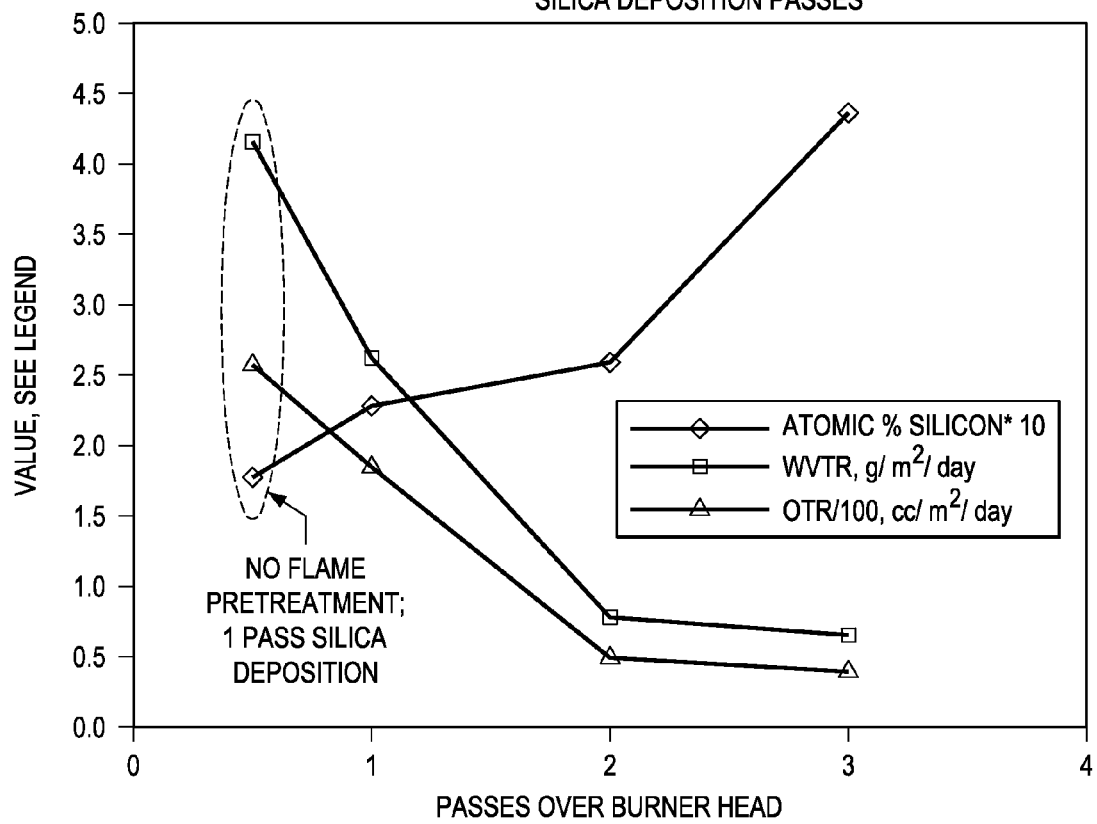
FIG. 8 is a graph showing the atomic percentage of silicon atoms on the film surface, WVTR, and OTR values plotted versus the number of silica deposition passes.

The ultimate arbiter of effectiveness is barrier of the deposited silica layer. All of the samples from above in this example were metallized under standard vacuum metallization conditions to an optical density of 2.3. The atomic percentage of silicon atoms on the film surface, WVTR, and OTR values are shown in FIG. 8 and plotted versus the number of silica deposition passes. All samples were flame treated before the silica deposition passes except for the first sample labeled with a black oval, which had no flame pretreatment before a single silica deposition. Flame treatment and increasing number of silica passes result in lower WVTR and OTR, or increasing barrier. This increasing barrier results from a higher quality or more effective layer of aluminum metal deposited on the silica primed film.

Example 2

High Speed Deposition on OPP Film

The current example is a biaxially oriented polypropylene (BOPP) placed on a roll to roll coater as disclosed herein for a single pass flame treatment and single layer silica coating deposited in one pass. Typical processing conditions are as follows: line speed at about 900 ft/min (275 m/min); chill roll temperatures at about 54 degrees Celsius; the flame pretreatment with burner to film substrate distance of about 5 mm for flame pretreatment, a fuel to air ratio of about 0.95 for the flame pretreatment step, a natural gas flow rate of about 100 liters/min for a 1 meter wide line; the silica coating deposition step with burner to film distances of about 5 to 10 mm, a fuel air ratio of about 1.0, gas flow rates of about 75 to 100 liters/min for a 1 meter wide line, a precursor concentration of in the range of about 0.0001 mole % to 0.01 mole % of the gas stream and plasma temperatures at 1200 degrees Celsius. The film samples were then metallized under standard conditions to an optical density of 2.5. The above described operating conditions produced a film substrate with a WVTR of <0.2 g/m2/day and an OTR of <20 cc/m2/day. WVTR and OTR data for a variety of working distances (flame burner to film substrate distance), gas flow rate, and precursor concentration (TEOS) are given in Table 1.

TABLE 1

| Sample Number | Working Distance, mm | Precursor Conc, Mole % | Gas Flow, l/min | WVTR, g/m$^2$/day | OTR, cc/m$^2$/day |
|---|---|---|---|---|---|
| 1 | 5.00 | 0.0038 | 75.00 | 0.05 | 10.9 |
| 2 | 5.00 | 0.0038 | 100.00 | 0.12 | 12.8 |
| 3 | 10.00 | 0.0038 | 75.00 | 0.08 | 10.5 |
| 4 | 10.00 | 0.0038 | 100.00 | 0.08 | 6.86 |
| 5 | 5.00 | 0.0049 | 75.00 | 0.09 | 9.09 |
| 6 | 5.00 | 0.0049 | 100.00 | 0.12 | 17.7 |
| 7 | 10.00 | 0.0049 | 75.00 | 0.15 | 10.5 |
| 8 | 10.00 | 0.0049 | 100.00 | 0.09 | 9.75 |
| 9 | 5.00 | 0.0095 | 75.00 | 0.07 | 11.8 |
| 10 | 5.00 | 0.0095 | 100.00 | 0.13 | 10.1 |
| 11 | 10.00 | 0.0095 | 75.00 | 0.09 | 10.1 |
| 12 | 10.00 | 0.0095 | 100.00 | 0.16 | 25.2 |

The data in Table 1 demonstrates the robustness of the silica deposition and primer process. The speeds employed in this example are similar, if not identical, to the line speeds in the typical film substrate production process.

Example 3

Multiple Layer Silica Deposition on OPP Film

Experiments were conducted with multiple laps over a film to produce pure silica coating between 10 to 50 nm. The coatings were produced under the following conditions: line speeds of about 600 to 900 FPM (180 m/min to 275 m/min), the flame treatment with flame burner to film substrate distance of about 5 mm for the flame treatment step, a fuel to air ratio of about 0.95, and a natural gas flow rate of about 100 liters/min for a 0.3 meter wide line. For the coating deposition step, a flame burner to film substrate distance of about 5 to 15 mm, a fuel to air ratio of about 1.0, gas flow rates of about 75 to 100 liters/min for a 0.3 meter wide line, and a precursor concentration in the range of 0.0001 mole % to 0.01 mole % of the gas stream. The plasma temperatures were about 1250 degrees Celsius. A number of silica laps were made between about 36 and 72.

Unless otherwise indicated, all numbers expressing quantities of ingredients, properties such as molecular weight, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. While the invention has been particularly shown and described with reference to a preferred embodiment, it will be understood by those skilled in the art that various changes in form and detail may be made therein without departing from the spirit and scope of the invention.

We claim:

1. A method of coating a film substrate with at least one inorganic oxide layers comprising:

pretreating said substrate by passing said substrate through at least one flame treatment flame head assembly supplied with no inorganic oxide precursor;

after said pretreating step, depositing two or more inorganic oxide layers on said substrate by passing said substrate through two or more deposition flame heads on at least one deposition flame head assembly supplied with at least one inorganic oxide precursor, wherein said pretreating and depositing steps occur at open atmosphere;

said depositing step is performed at a flame temperature that ranges from 650° C. to 1450° C.;

said pretreatment step substantially enhances an atomic percentage of inorganic oxide in said inorganic oxide layers during said deposition step such that WVTR of said inorganic layers is <0.2 g/m$^2$/day; and OTR of said inorganic layers is <20 cc/m$^2$/day.

2. The method of claim 1 wherein said at least one inorganic oxide precursor comprises at least one of tetraethyl orthosilicate, tetramethyl disiloxane, silicon tetrachloride, silane, trimethylaluminium, triethylaluminium, methylaluminiumdichlorid-diethyletherate, trimethylaluminium-diethyletherate, ethylaluminiumdichlorid-diethyletherate, diethylaluminium-dimethylamide, aluminum trichloride, and aluminum halides.

3. The method of claim 1 wherein said pretreating step comprising passing said substrate over a portion of at least one chill roll.

4. The method of claim 1 wherein said pretreating step comprises passing said substrate over a portion of multiple chill rolls.

5. The method of claim 3 wherein said chill roll comprises a temperature of 40° C. to 80° C.

6. The method of claim 1 wherein said pretreating and depositing steps occur as said film substrate is unwound from one roll and wound onto a second roll.

7. The method of claim 1 wherein said pretreating and depositing steps occur in-line during manufacturing of said film substrate.

8. The method of claim 1 wherein said film substrate is cooled during said pretreating step by spraying cooling fluid on said film substrate.

* * * * *